United States Patent
Shibata et al.

(10) Patent No.: US 7,813,171 B2
(45) Date of Patent: Oct. 12, 2010

(54) SEMICONDUCTOR MEMORY DEVICE

(75) Inventors: Noboru Shibata, Kawasaki (JP);
Kazunori Kanebako, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/564,618

(22) Filed: Nov. 29, 2006

(65) Prior Publication Data

US 2007/0121378 A1 May 31, 2007

Related U.S. Application Data

(63) Continuation of application No. PCT/JP2005/020748, filed on Nov. 11, 2005.

(30) Foreign Application Priority Data

Nov. 12, 2004 (JP) ............................. 2004-329343

(51) Int. Cl.
*G11C 16/04* (2006.01)
(52) U.S. Cl. ............................ 365/185.03; 365/185.17
(58) Field of Classification Search ............ 365/185.17, 365/185.03
See application file for complete search history.

(56) References Cited

U.S. PATENT DOCUMENTS

| | | | | | |
|---|---|---|---|---|---|
| 5,587,948 | A | * | 12/1996 | Nakai ..................... | 365/185.17 |
| 5,815,439 | A | * | 9/1998 | Korsh et al. ............. | 365/185.24 |
| 5,844,841 | A | * | 12/1998 | Takeuchi et al. ........ | 365/185.03 |
| 5,870,218 | A | * | 2/1999 | Jyouno et al. .......... | 365/185.03 |
| 5,894,435 | A | * | 4/1999 | Nobukata ............... | 365/185.03 |
| 6,134,140 | A | | 10/2000 | Tanaka et al. | |
| 6,657,891 | B1 | | 12/2003 | Shibata et al. | |
| 7,298,648 | B2 | * | 11/2007 | Lee et al. ................ | 365/185.03 |
| 2006/0279993 | A1 | | 12/2006 | Shibata | |

FOREIGN PATENT DOCUMENTS

| | | |
|---|---|---|
| JP | 11-176175 A | 7/1999 |
| JP | 2000-195280 A | 7/2000 |
| JP | 2004-192789 | 7/2004 |
| JP | 2004-192789 A | 7/2004 |
| JP | 2004-334956 | 11/2004 |
| JP | 2006139864 A * | 6/2006 |
| KR | 10-2004-0048344 | 6/2004 |

OTHER PUBLICATIONS

U.S. Appl. No. 11/610,193, filed Dec. 13, 2006, Fukuka, et al.
Japanese Office Action Application No. 2004-329343 with English translation, dated May 25, 2010, 9 pages.

* cited by examiner

*Primary Examiner*—Huan Hoang
*Assistant Examiner*—Fernando N Hidalgo
(74) *Attorney, Agent, or Firm*—Oblon, Spivak, McClelland, Maier & Neustadt, L.L.P.

(57) ABSTRACT

In a memory cell array, a plurality of memory cells which store data in the form of n values (n is a natural number which is not smaller than 2) which are in first and second to nth states are arranged in a matrix form. Before a write operation of storing data in a first memory cell in the memory cell array, when at least one second memory cell which is adjacent to the first memory cell is in the first state and does not reach a first threshold voltage, a control circuit performs a write operation in the second memory cell up to the first threshold voltage.

17 Claims, 25 Drawing Sheets

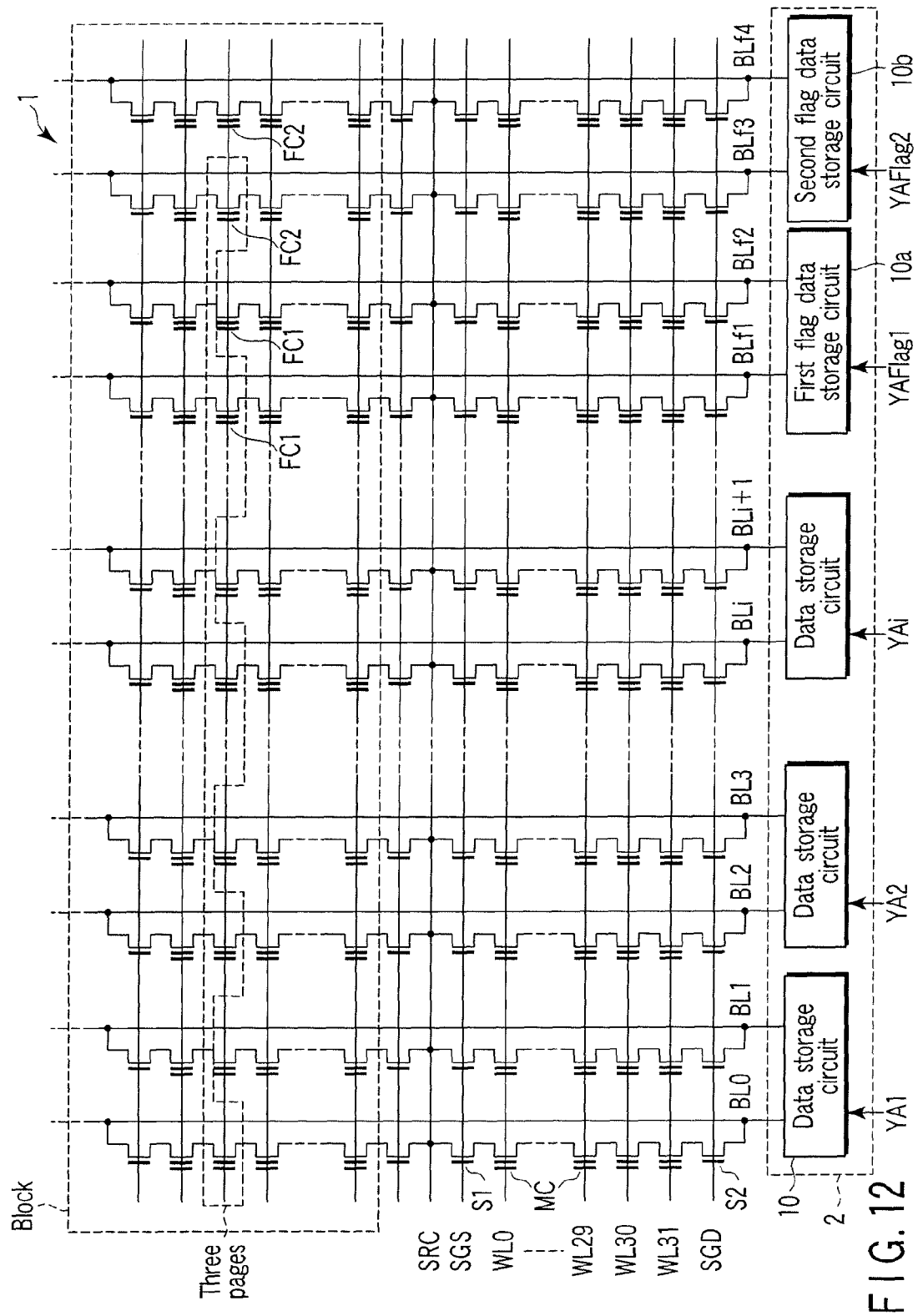
F I G. 12

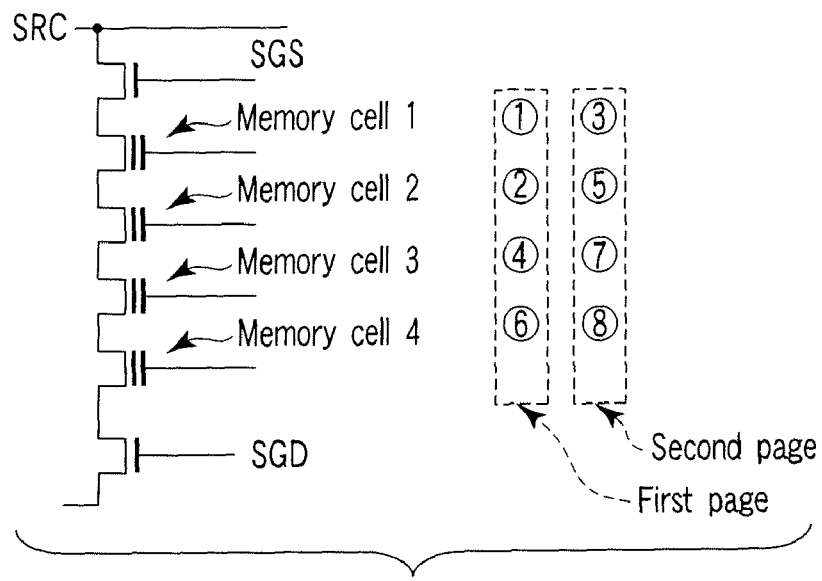
F I G. 21
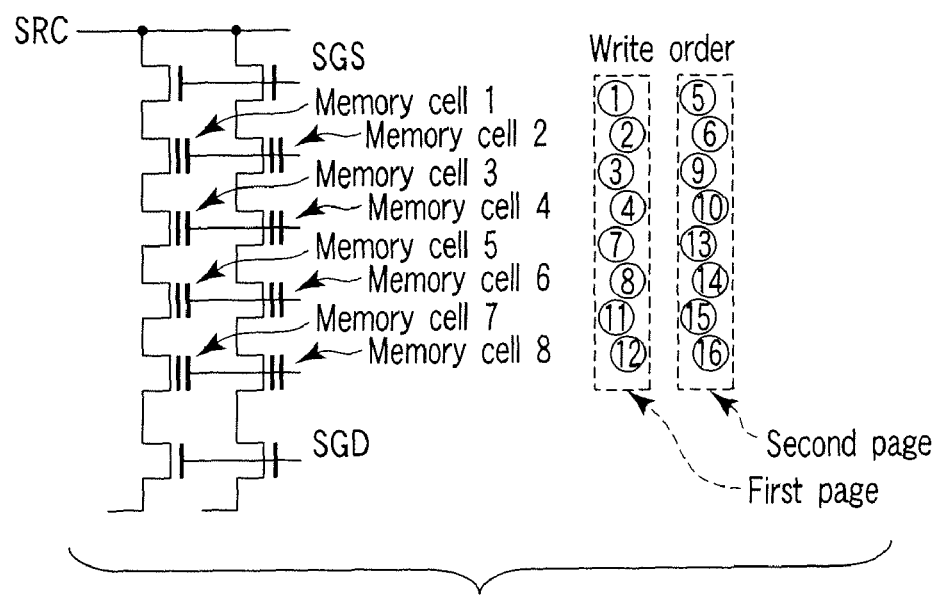
F I G. 22

SEMICONDUCTOR MEMORY DEVICE

CROSS REFERENCE TO RELATED APPLICATIONS

This is a Continuation Application of PCT Application No. PCT/JP2005/020748, filed Nov. 11, 2005, which was published under PCT Article 21(2) in Japanese.

This application is based upon and claims the benefit of priority from prior Japanese Patent Application No. 2004-329343, filed Nov. 12, 2004, the entire contents of which are incorporated herein by reference.

BACKGROUND OF THE INVENTION

1. Field of the Invention

The present invention relates to, e.g., a semiconductor memory device capable of storing data consisting of two or more bits in a single memory cell.

2. Description of the Related Art

There has been proposed a non-volatile semiconductor memory device which is a NAND flash memory using an EEPROM and can store multivalued data in a single memory cell (see, e.g., Jpn. Pat. Appln. KOKAI Publication No. 2000-195280). In a NAND flash memory, all or a half of memory cells arranged in a row direction are connected with corresponding latch circuits through bit lines, respectively. Each latch circuit holds data in data write and read operations. Data is collectively written into or read from all or a half of cells arranged in the row direction.

Meanwhile, miniaturization of an element has advanced, and a distance between cells is becoming short. In addition to this, a capacity between floating gates (an FG-FG capacity) of cells adjacent to each other is increasing. Therefore, there occurs a problem that a threshold voltage of a cell in which data has been previously written fluctuates when data is written in an adjacent cell. In particular, since a multivalued memory which stores multi-bit data in one cell stores corresponding data based on a plurality of threshold voltages, it is required to control a distribution of one threshold voltage to be extremely narrowed. Therefore, a problem of a fluctuation in a threshold voltage due to writing data in an adjacent cell is prominent.

In order to solve this problem, the following method has been considered. For example, when i-bit (i<k) data is stored in a memory cell capable of storing k-bit data, data consisting of i or smaller bits is written in an adjoining cell before storing the next data. As a result, it is possible to ideally suppress a fluctuation in a threshold voltage to 1/3 in the case of a cell storing four values, 1/7 in the case of a cell storing eight values, and 1/(n−1) in the case of a cell storing n values (see, e.g., Jpn. Pat. Appln. KOKAI Publication No. 2004-192789).

The above-described method suppresses a fluctuation in a threshold voltage with respect to a cell having data written therein, but this method is not applied to a cell having no data written therein after erasing data. Therefore, a threshold voltage of a cell in an erased state (which will be referred to as an erase cell hereinafter) is affected by data which is written in an adjacent cell. Therefore, a threshold voltage of an erase cell must be set low in accordance with this influence. However, when a threshold voltage of an erase cell is set lower, a variation of a threshold voltage is increased when writing necessary data, and suppressing the threshold voltage to an ideal value is difficult. Therefore, the present invention provides a semiconductor memory device capable of suppressing a change in a threshold voltage of an erase cell.

BRIEF SUMMARY OF THE INVENTION

According to a first aspect of the present invention, there is provided a semiconductor memory device comprising: a memory cell array in which a plurality of memory cells storing data in the form of n values (n is a natural number which is not smaller than 2) which are in first and second to nth states are arranged in a matrix form; and a control circuit which performs a write operation in a second memory cell up to a first threshold voltage when at least one second memory cell adjacent to a first memory cell is in the first state and does not reach the first threshold voltage before a write operation of storing data in the first memory cell in the memory cell array.

According to a second aspect of the present invention, there is provided a semiconductor memory device comprising: a memory cell array having a structure in which a plurality of memory cells storing first, second, third and fourth states are arranged in a matrix form; and a control circuit which performs a write operation up to a first threshold voltage when at least one second memory cell adjacent to a first memory cell is in the first state and does not reach the first threshold voltage before storing the next data consisting of at least one value in the first memory cell having the first or third state stored therein in the memory cell array, and then holds the first state or performs a write operation in the second state when the first memory cell has the first state, and holds the third state or performs a write operation to attain the fourth state when the first memory cell has the third state.

According to a third aspect of the present invention, there is provided a semiconductor memory device comprising: a memory cell array in which a plurality of memory cells storing n values (n is a natural number which is not smaller than 2) which are in first and second to nth states are arranged in a matrix form; and a control circuit which performs a write operation up to a first threshold voltage when a first memory cell is in the first state and does not reach the first threshold voltage in the case of storing the next data having at least one value in the first memory cell having j-valued (j<n) data stored therein in the memory cell array.

BRIEF DESCRIPTION OF THE SEVERAL VIEWS OF THE DRAWING

FIG. 12 is a circuit diagram showing an example of a memory cell array and data storage circuits applied to a third embodiment;

FIG. 21 is a view showing a write order according to the fifth embodiment;

FIG. 22 is a view of a write order showing a modification of the fifth embodiment;

DETAILED DESCRIPTION OF THE INVENTION

Embodiments according to the present invention will now be described hereinafter with reference to the accompanying drawings.

First Embodiment

Figure 2:
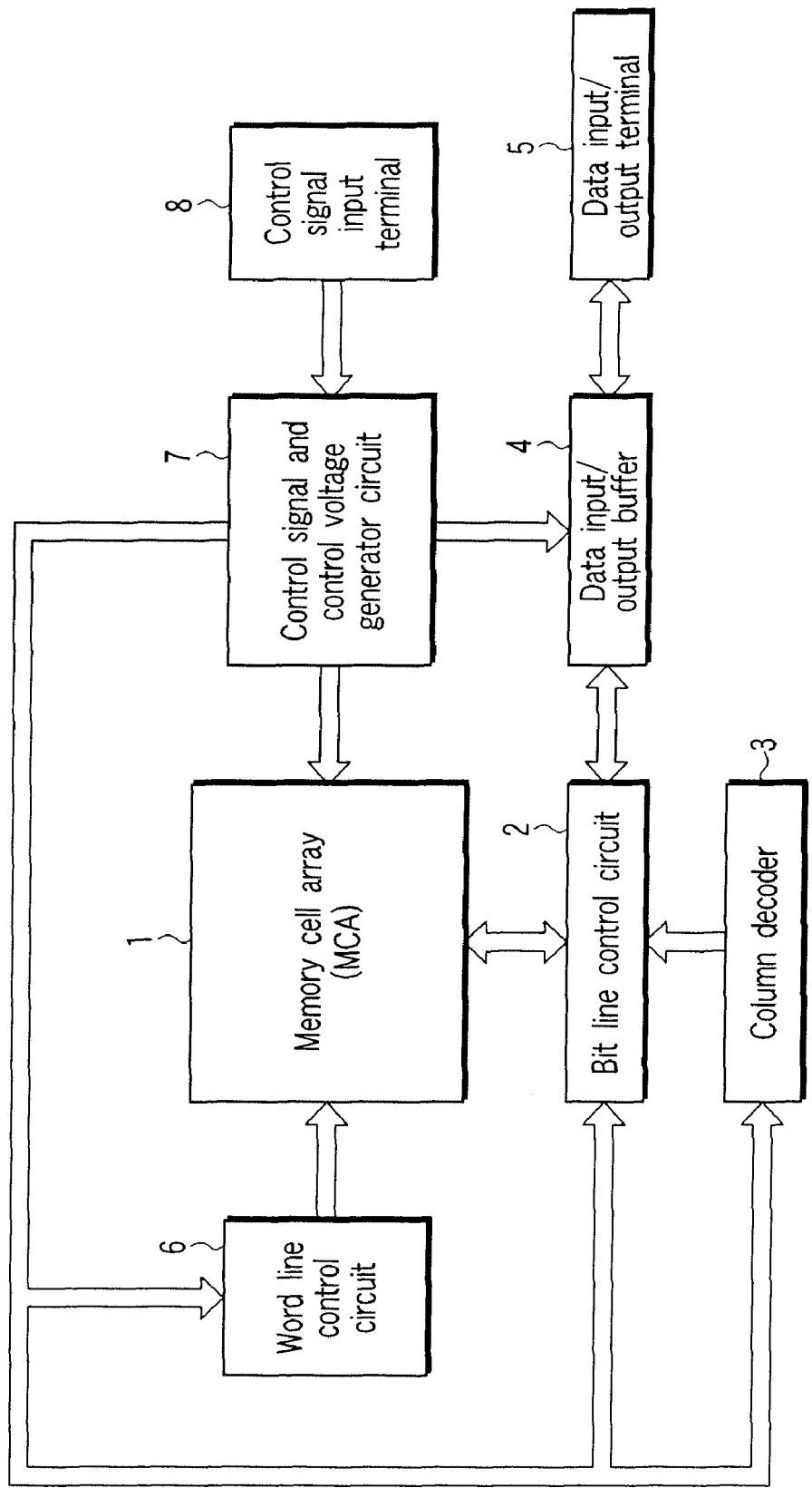
FIG. 2 is a view showing an outline structure of a non-volatile semiconductor memory device.

FIG. 2 shows an outline configuration of a non-volatile semiconductor memory device, e.g., a configuration of a NAND flash memory which stores four values (two bits).

A memory cell array 1 includes a plurality of bit lines, a plurality of word lines, and a common source line, and electrically rewritable memory cells made up of, e.g., EEPROM cells are arranged in a matrix in the memory cell array 1. A bit line control circuit 2 which controls bit lines and a word line control circuit 6 are connected to this memory cell array 1.

The bit line control circuit includes a plurality of data storage circuits and a flag data storage circuit as will be described later. This bit line control circuit 2 reads data in a memory cell of the memory cell array 1 via a bit line, detects a state of a memory cell of the memory cell array 1 via a bit line, or writes data into a memory cell of the memory cell array 1 by applying a write control voltage the memory cell via a bit line. A column decoder 3 and a data input/output buffer 4 are connected to the bit line control circuit 2. The data storage circuit in the bit line control circuit 2 is selected by the column decoder 3. Data in the memory cell read into the data storage circuit is output via the data input/output buffer 4 from a data input/output terminal 5 to the outside.

Further, write data input from the outside to the data input/output terminal 5 is input via the data input/output buffer 4 to the data storage circuit selected by the column decoder 3.

The word line control circuit 6 is connected to the memory cell array 1. This word line control circuit 6 selects a word line in the memory cell array 1, and applies to the selected word line a voltage necessary for a read, write or erase operation.

The memory cell array 1, the bit line control circuit 2, the column decoder 3, the data input/output buffer 4, and the word line control circuit 6 are connected to and controlled by a control signal and control voltage generator circuit 7. The control signal and control voltage generator circuit 7 is connected to a control signal input terminal 8 and is controlled by a control signal input via the control signal input terminal 8 from the outside.

The bit line control circuit 2, the column decoder 3, the word line control circuit 6, and the control signal and control voltage generator circuit 7 constitute a write circuit and a read circuit.

Figure 3:
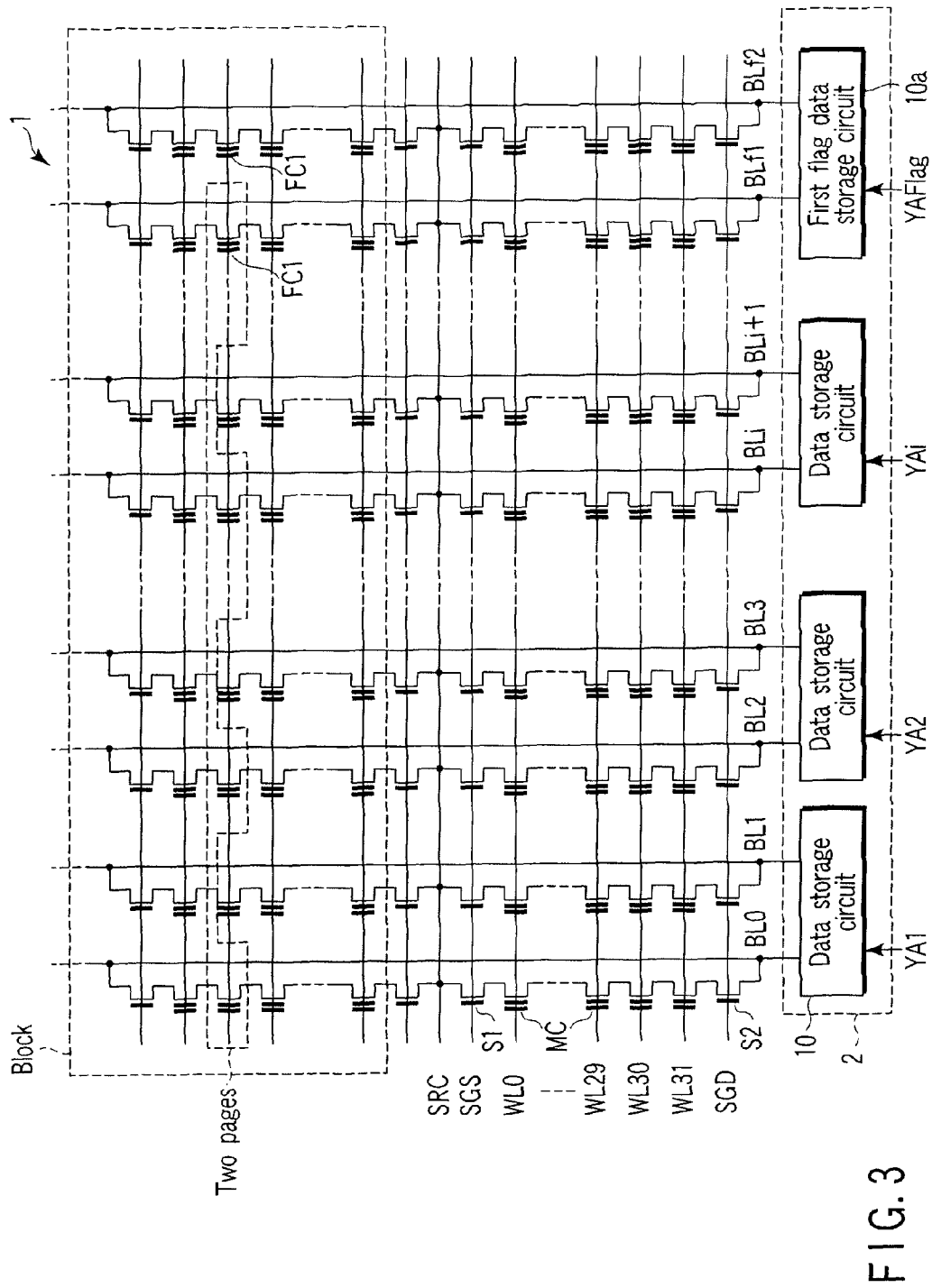
FIG. 3 is a circuit diagram showing a structure of a memory cell array and a bit line control circuit depicted in FIG. 2 according to the first embodiment.

FIG. 3 shows a configuration of the memory cell array 1 and the bit line control circuit 2 depicted in FIG. 2. In the memory cell array 1, a plurality of NAND cells are arranged. One NAND cell is composed of, e.g., a memory cell MC made up of, e.g., 32 EEPROMs connected in series and select gates S1 and S2. The select gate S2 is connected to a bit line BL0, and the select gate S1 is connected to a source line SRC. Control gates of the memory cells MC arranged in each row are connected equally to word lines WL0, WL1 and WL2 to WL31. Furthermore, select gates S2 are connected equally to a select line SGD, and select gates S1 are connected equally to a select line SGS.

The bit line control circuit 2 has a plurality of data storage circuits 10 and a first flag data storage circuit 10a. Pairs of bit lines (BL0, BL), (BL2, BL3) ... (BLi, BLi+1), (BLf1, BLf2) are connected to the individual data storage circuits 10 and the first flag data storage circuit 10a.

The memory cell array 1 includes a plurality of blocks as shown by a broken line. Each block is composed of a plurality of NAND cells, and data is erased in blocks. Moreover, an erase operation is carried out simultaneously on the two bit lines connected to the data storage circuit 10 and the first flag data storage circuit 10a.

Additionally, a plurality of memory cells (or memory cells enclosed by a broken line) arranged for every other bit line and connected to one word line constitute one sector. Data is written or read in sectors. Data corresponding to, e.g., two pages is stored in one sector. Further, a plurality of first flag cells FC1 which store flags are connected to each word line. That is, in this embodiment, one sector includes one first flag cell FC1.

In a read operation, a program verify operation, and a program operation, one of two bit lines (BLi, BLi+1) connected to the data storage circuit 10 or 10a is selected in accordance with an address signal (YA1, YA2 ... YAi, YAFlag) supplied from the outside. Furthermore, one word line is selected in accordance with an external address, thereby selecting one selector (corresponding to two pages). This switching of two pages is carried out based on an address.

Figure 4A:
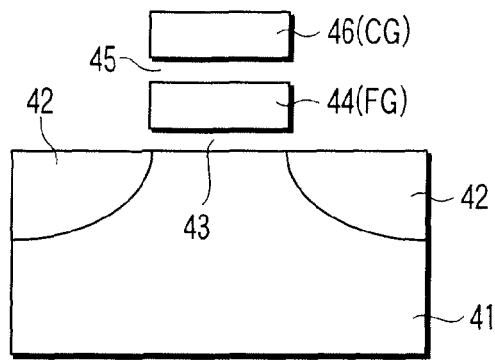
FIG. 4A is a cross-sectional view showing a memory cell.
Figure 4B:
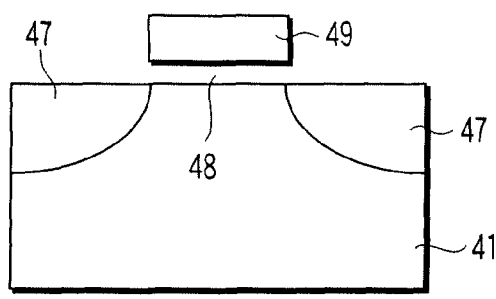
FIG. 4B is a cross-sectional view showing a select transistor.

FIGS. 4A and 4B show a cross-sectional view of a memory cell and that of a select transistor, respectively. FIG. 4A shows a memory cell. In a substrate 41, an n-type diffused layer 42 is formed as a source and a drain of a memory cell. A floating gate (FG) 44 is formed via a gate insulating film 43 above the substrate 41, and a control gate (CG) 46 is formed via an insulating film 45 above this floating gate 44. FIG. 4B shows a select gate. In the substrate 41, an n-type diffused layer 47 acting as a source and a drain is formed. Above the substrate 41, a control gate 49 is formed via a gate insulating film 48.

Figure 5:
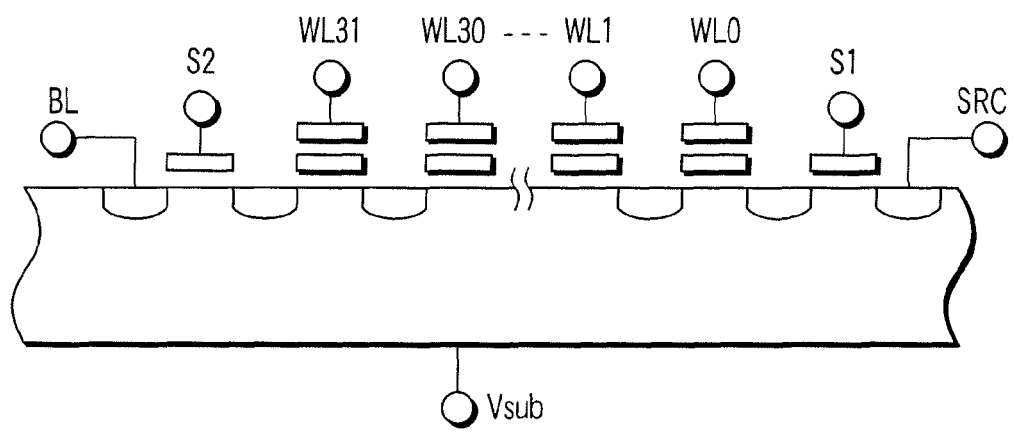
FIG. 5 is a cross-sectional view showing one NAND cell in the memory cell array.

FIG. 5 shows a cross section of one NAND cell in the memory cell array 1. In this example, 32 memory cells MC having the structure depicted in FIG. 4A are connected in series to constitute one NAND cell. A select gate S1 and a select gate S2 having the structure depicted in FIG. 4B are provided on a source side and a drain side of the NAND cell.

Figure 6:
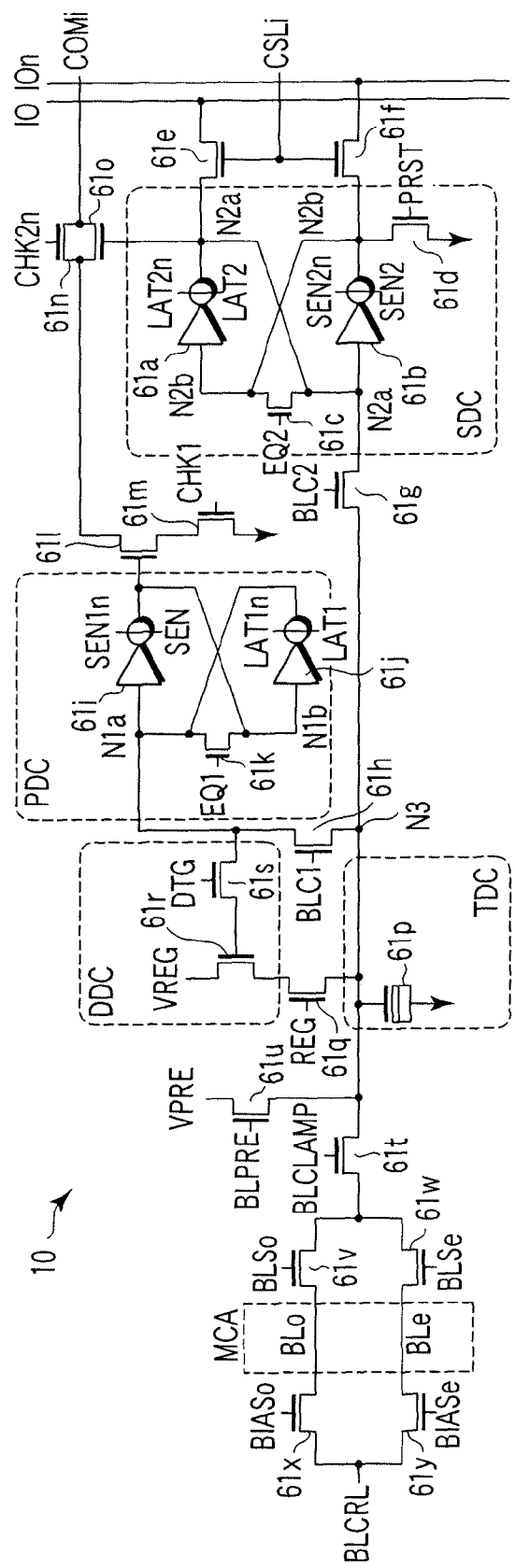
FIG. 6 is a circuit diagram showing an example of a data storage circuit depicted in FIG. 3.

FIG. 6 is a circuit diagram showing an example of the data storage circuit 10 depicted in FIG. 3. The first flag data storage circuit 10a also has the same configuration as that of the data storage circuit 10.

This data storage circuit 10 has a primary data cache (PDC), a secondary data cache (SDC), a dynamic temporarily hold data in a verify operation, and are used for the manipulation of internal data in storing multivalued data. The TDC amplifies data on a bit line and holds the data temporarily in a data read operation, and is used for the manipulation of internal data in storing multivalued data.

The SDC is composed of clocked inverter circuits 61a and 61b constituting a latch circuit and transistors 61c and 61d. The transistor 61c is connected between an input end of the clocked inverter circuit 61a and an input end of the clocked inverter circuit 61b. A signal EQ2 is supplied to a gate of this transistor 61c. The transistor 61d is connected between an output end of the clocked inverter circuit 61b and the ground. A signal PRST is supplied to a gate of this transistor 61d. A node N2a of the SDC is connected via a column select transistor 61e to an input/output data line IO, and a node N2b is connected vial a column select transistor 61f to an input/output data line IOn. A column select signal CSLi is supplied to gates of these transistors 61e and 61f. The node N2a of the SDC is connected to a node N1a of the PDC via transistors 61g and 61h. A signal BLC2 is supplied to a gate of the transistor 61g, and a signal BLC1 is supplied to a gate of the transistor 61h.

The PDC is composed of clocked inverter circuits 61i and 61j and a transistor 61k. The transistor 61k is connected between an input end of the clocked inverter circuit 61i and an input end of the clocked inverter circuit 61j. A signal EQ1 is supplied to a gate of this transistor 61k. A node N1b of the PDC is connected with a gate of a transistor 61l. One end of a current path of this transistor 61l is connected to the ground via a transistor 61m. A signal CHK1 is supplied to a gate of this transistor 61m. Moreover, the other end of the current path of the transistor 61l is connected with one end of a current path of transistors 61n and 61o constituting a transfer gate. A signal CHK2n is supplied to a gate of this transistor 61n. A gate of the transistor 61o is connected to the node N2a of the SDC. A signal COMi is supplied to the other end of the current path of the transistors 61n and 61o. This signal COMi, which is common to all of the data storage circuits 10, is a signal to indicate whether all of the data storage circuits 10 have been verified. That is, as will be described later, if they have been verified, the node N1b of the PDC goes low. In this state, when the signals CHK1 and CHK2n are made high, if the verification has been completed, the signal COMi goes high.

Additionally, the TDC is constituted of, e.g., an MOS capacitor 61p. This capacitor 61p is connected between a junction node N3 of the transistors 61g and 61h and the ground. Further, the DDC is connected to the junction node N3 through a transistor 61q. A signal REG is supplied to a gate of the transistor 61q.

The DDC is composed of transistors 61r and 61s. A signal VREG is supplied to one end of a current path of the transistor 61r, and the other end of the same is connected to a current path of the transistor 61q. A gate of this transistor 61r is connected with the node N1a of the PDC via the transistor 61s. A signal DTG is supplied to a gate of this transistor 61s.

Furthermore, one end of a current path of transistors 61t and 61u is connected to the junction node N3. A signal VPRE is supplied to the other end of the current path of the transistor 61u, and BLPRE is supplied to a gate of the transistor 61u. A signal BLCLAMP is supplied to a gate of the transistor 61t. The other end of a current path of this transistor 61t is connected to one end of a bit line BLo via a transistor 61v and one end of a bit line BLe via a transistor 61w. The other end of the bit line BLo is connected to one end of a current path of a transistor 61x. A signal BIASo is supplied to a gate of this transistor 61x. The other end of a bit line BLe is connected to one end of a current path of a transistor 61y. A signal BIASe is supplied to a gate of this transistor 61y. A signal BLCRL is supplied to the other ends of the current paths of these transistors 61x and 61y. The transistors 61x and 61y are turned on according to signals BIASo and BIASe to be complementary to the transistors 61v and 61w, thereby supplying the potential of the signal BLCRL to the unselected bit lines.

The individual signals and voltages are generated at the control signal and control voltage generator circuit 7, and the following operations are put under control of this control signal and control voltage generator circuit 7.

This memory is a multivalued memory and capable of storing, e.g., two-bit data in one cell. This switching of two bits is carried out based on addresses (a first page or a second page).

(Description of Operations)

FIG. 1 shows a relationship between data in a memory cell and a threshold voltage of the memory cell. When erasing is done, the data in the memory cell becomes "0" (a negative threshold voltage). As shown in FIG. 1A, when a write operation of a first page is performed, the data in the memory cell becomes data "0" and, e.g., data "2". As shown in FIG. 1B, data which is equal to or smaller than first data in an adjacent cell is written in the adjacent cell before second page writing. Then, a threshold voltage distribution of each of the data "0" and "2" is increased based on the data written in this cell. In the first embodiment, as shown in FIG. 1C, a slight write operation (which will be referred to as a soft program operation hereinafter) is carried out with respect to an erase cell from which the data "0" has been stored before second page writing, and the threshold voltage distribution of the data "0" is narrowed toward a higher threshold voltage. Then, when data of a second page is written, the data in the memory cell changes to data "0" to "3" each having an original voltage as shown in FIG. 1D. In the first embodiment, the data in the memory cell is defined in an ascending order of threshold voltages.

Figure 7:
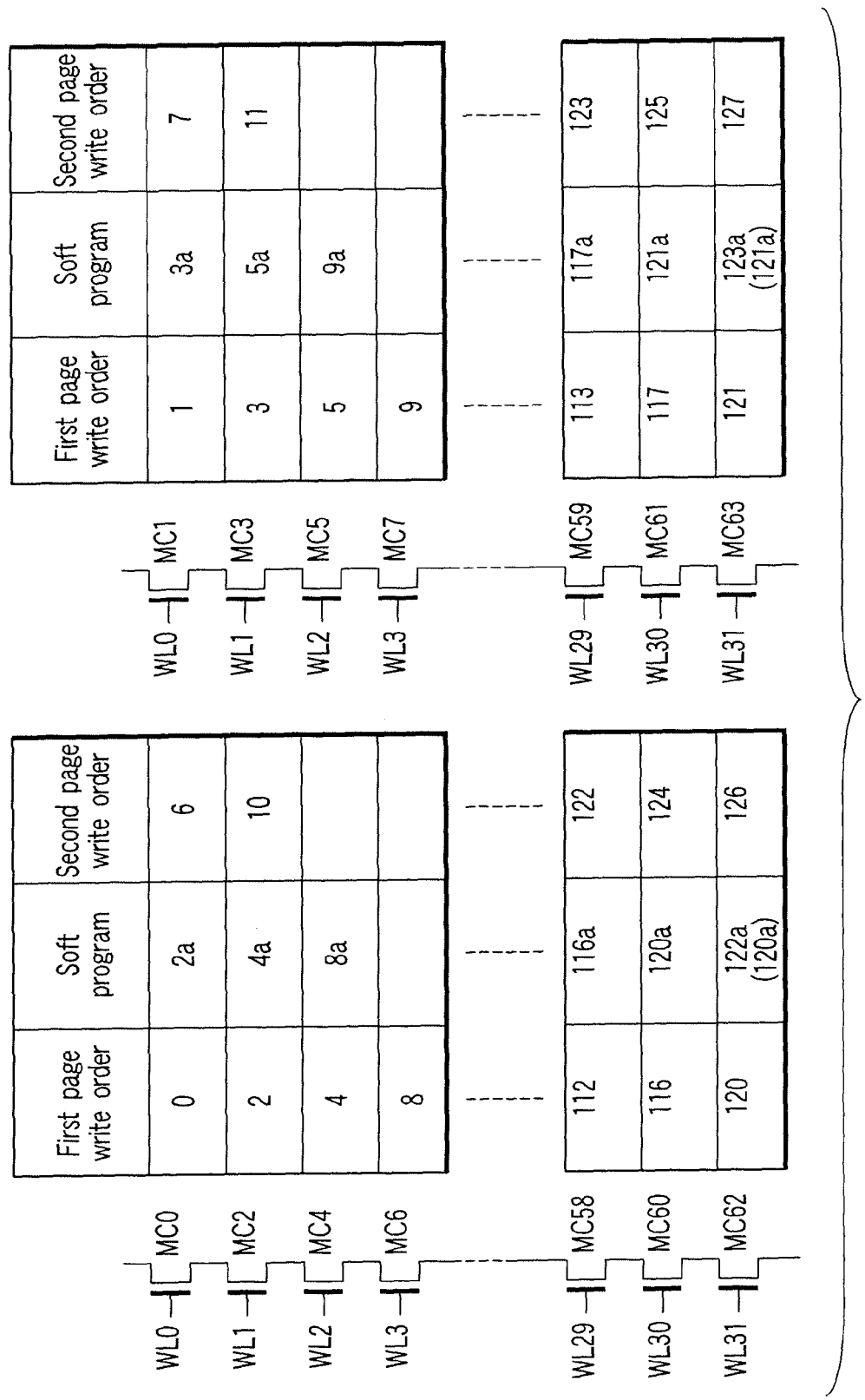
FIG. 7 is a view showing a write order of memory cells according to the first embodiment.

FIG. 7 shows a write order of memory cells according to the first embodiment. In a block, a write operation is carried out from a memory cell close to the source line SRC in accordance with each page. As shown in FIG. 7, memory cells arranged from the source line SRC side toward the bit line side are defined as MC0 to MC31, and the write order will be described.

In a zeroth write operation, one-bit data is written in a first page of the memory cell MC0.

In a first write operation, one-bit data is written in a first page of the memory cell MC1 adjacent to the memory cell MC0 in a row direction.

In a second write operation, one-bit data is written in a first page of the memory cell MC2 adjacent to the memory cell MC0 in a column direction.

Figure 1A:
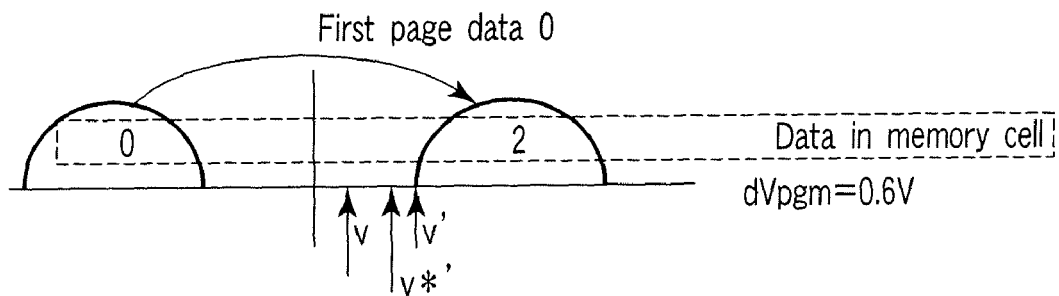
FIG. 1A is a view showing a program operation in a first embodiment.
Figure 1B:
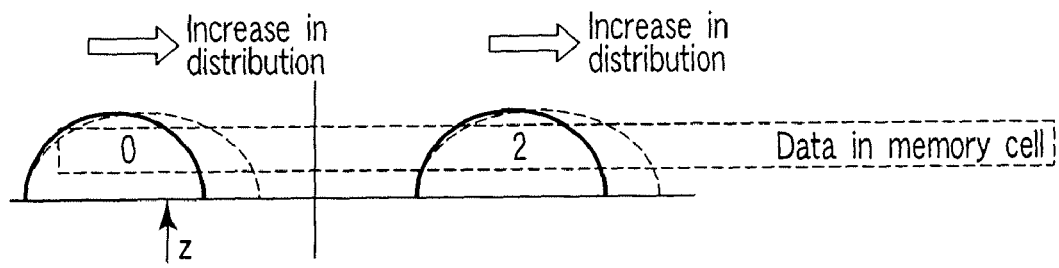
FIG. 1B is a view showing a program operation in the first embodiment.
Figure 1C:
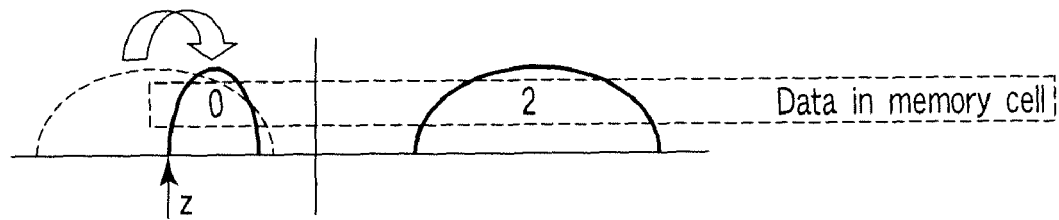
FIG. 1C is a view showing a program operation in the first embodiment.

Then, in a 2ath write operation, when data in the memory cell MC0 is "0" and a threshold voltage is lower than "z" as shown in FIG. 1C, the soft program operation is executed until the threshold voltage exceeds "z".

In a third write operation, one-bit data is written in a first page of the memory cell MC3 diagonally adjacent to the memory cell MC0.

Then, in a 3ath write operation, when data in the memory cell MC3 is "0" and a threshold voltage is lower than "z", the soft program operation is executed until the threshold voltage exceeds "z".

In a fourth write operation, one-bit data is written in a first page of the memory cell MC4 adjacent to the memory cell MC1 in the column direction.

Then, in a 4ath write operation, when data in the memory cell MC2 is "0" and a threshold voltage is lower than "z", the soft program operation is executed until the threshold voltage exceeds "z".

In a fifth write operation, one-bit data is written in a first page of the memory cell MC5 diagonally adjacent to the memory cell MC2.

Then, in a 5ath write operation, when data in the memory cell MC3 is "0" and a threshold voltage is lower than "z", the soft program operation is executed until the threshold voltage exceeds "z".

In a sixth write operation, one-bit data is written in a second page of the memory cell MC0.

In a seventh write operation, one-bit data is written in a second page of the memory cell MC1.

In an eighth write operation, one-bit data is written in a first page of the memory cell MC6 adjacent to the memory cell MC4 in the column direction.

Then, in an 8ath write operation, when data in the memory cell MC4 is "0" and a threshold voltage is lower than "z", the soft program operation is executed until the threshold voltage exceeds "z".

In a ninth write operation, one-bit data is written in a first page of the memory cell MC7 diagonally adjacent to the memory cell MC4.

Then, in a 9ath write operation, when data in the memory cell MC5 is "0" and a threshold voltage is lower than "z", the soft program operation is executed until the threshold voltage exceeds "z".

In a 10th write operation, one-bit data is written in a second page of the memory cell MC2.

In an 11th write operation, one-bit data is written in a second page of the memory cell MC3.

Subsequently, data is likewise sequentially written in the memory cells.

Here, after a 120th write operation or a 122nd write operation, in a 120ath write operation or a 122ath write operation, when a threshold voltage of data "0" in the memory cell MC62 is lower than "z", the soft program is executed until the threshold voltage exceeds "z". Further, after a 121st write operation or a 123rd write operation, in a 121ath write operation or a 123ath write operation, when a threshold voltage of data "0" in the memory cell MC63 is lower than "z", the soft program operation is executed until the threshold voltage exceeds "z".

(Program Operation and Program Verify Operation)

Specific program and program verify operations will now be described hereinafter with reference to FIGS. 8 and 9.

(First Page Program Operation)

Figure 8:
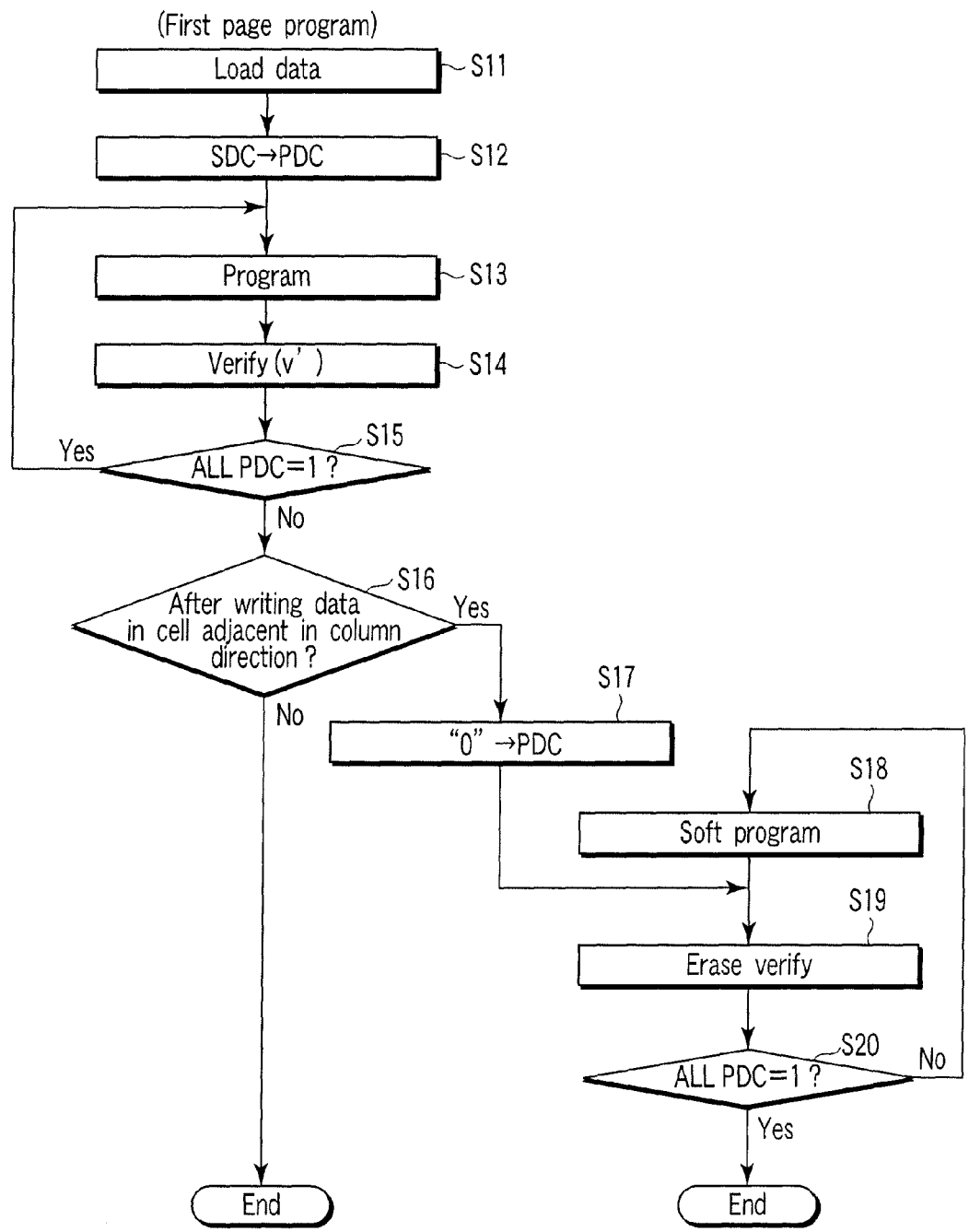
FIG. 8 is a flowchart showing a first page program operation according to the first embodiment.

FIG. 8 shows a first page program operation. In a program operation, an address is first specified, and two pages (one sector) shown in FIG. 3 are selected. This memory can operate only in the order of the first page and the second page in the two pages. Therefore, the first page is first selected based on the address.

Then, data to be written is input from the outside, and stored in the SDCs in all the data storage circuits 10 (S11). Subsequently, when a write command is input, data in the SDCs of all the data storage circuits 10 shown in FIG. 6 is transferred to the PDCs (S12). The node N1$a$ of the PDC changes to a high level when data "1" (writing is not executed) is supplied from the outside, and the node N1$a$ of the PDC enters a low level when data "0" (writing is executed) is supplied. Then, data of the PDC is set to a potential of the node N1$a$, and data of the SDC is set to a potential of the node N2$a$.

(Program Operation) (S13)

Assuming that a potential of the signal BLC1 shown in FIG. 6 is Vdd+Vth, when data "1" (writing is not executed) is stored in the PDC, a potential of a bit line is set to Vdd. On the other hand, when data "0" (writing is executed) is stored in the PDC, a potential of the bit line is set to Vss. Furthermore, writing must not be executed in a cell which is connected to a selected word line and has a non-selected page (a bit line is not selected). Therefore, a potential Vdd is supplied to a bit line connected to such a cell like the example of data "1".

Here, a potential Vdd is supplied to a select line SGD, Vpgm (20V) is supplied to a selected word line, and VPASS (10V) is supplied to a non-selected word line in a selected block. Then, when a bit line has a potential Vss, a channel of a cell is set to a potential Vss and a word line is set to Vpgm, thereby executing a write operation. On the other hand, when the bit line has a potential Vdd, the channel of the cell increases Vpgm rather than Vss, thereby providing Vpgm/2 by coupling. Therefore, the program operation is not carried out.

When write data is "0", data in a memory cell becomes "2" as shown in FIG. 1. Moreover, when write data is "1", data in the memory cell remains as "0".

(First Page Verify Operation) (S14)

In a program verify operation, a potential "v'" which is slightly higher than a potential "v" in a read operation is supplied to a selected word line. Thereafter, "'" represents a verify potential and means a potential slightly higher than a potential in a read operation.

First, a read potential Vread (<Vpgm) is supplied to a non-selected word line and a select line SGD in a selected block, a voltage, e.g., Vdd+Vth is supplied to the signal BLPRE of the data storage circuit 10 shown in FIG. 6, a predetermined voltage, e.g., Vdd+Vth is fed to the signal BLCLAMP, and the signal VPRE is set to Vdd, thereby precharging a bit line.

Then, a potential, e.g., Vdd is supplied to a select line SGS on a source side of a cell. When a threshold voltage of the cell is higher than a potential v', the cell is turned off. Therefore, the bit line remains on the high level. On the other hand, when the threshold voltage of the cell is lower than the potential v', the cell is turned on. Therefore, a potential of the bit line becomes Vss. During discharge of the bit line, the node N3 of the TDC is set to a potential Vss, the signal REG is changed to the high level to turn on the transistor 61$q$, and data in the DDC is transferred to the TDC. Then, the signal DTG is changed to the high level to turn on the transistor 61$s$, and data in the PDC is transferred to the DDC. Subsequently, the transistor 61$h$ is turned on, and data in the TDC is transferred to the PDC. Then, the signal VPRE is set to a potential Vdd, the signal BLPRE is set to Vdd+Vth, the transistor 61$u$ is turned on, the node N3 of the TDC is pre-charged to the potential Vdd, and then a predetermined voltage is supplied to the signal BLCLAMP. The node N3 of the TDC is set to the low level when the bit line is on the low level, and it is set to the high level when the bit line is on the high level. Here, information indicative of the low level is stored in the DDC in the case of executing a write operation, and information indicative of the high level is stored in the DDC when a write operation is not executed. Therefore, when the signal VREG is set to the potential Vdd and the signal REG is changed to the high level, the node N3 of the TDC is forcibly changed to the high level only in a case where the write operation is not executed. After this operation, data in the PDC is transferred to the DDC, and a potential of the TDC is transferred to the PDC. The high level is latched in a memory cell only when a write operation is not performed and when data "1" has been written in the memory cell and a threshold voltage of the cell has reached a verify potential v'. Additionally, the low level is latched in the PDC when a threshold voltage of a cell does not reach the verify potential v'.

When the PDC is on the low level, the write operation is again executed, and the program operation and the verify operation are repeated until data in the PDC of each of all the data storage circuits 10 changes to the high level (S15).

It is to be noted that the number of times of the program and verify operations must be restricted, but the number of times of the program and verify operations is not important, thereby eliminating its explanation.

(Adjacent Cell Program Operation)

As shown in FIG. 7, after one-bit data is written in a first page of a memory cell MC0, one-bit data is written in a first page of a memory cell MC1 selected by the same word line as that of the memory cell MC0. Thereafter, one-bit data is written in a first page of a memory cell MC2 adjacent to the memory cell MC0 in a column (a bit line) direction. When these write operations are carried out, a threshold voltage of the memory cell MC0 varies due to an FG-FG capacity depending on write data, and a threshold voltage distribution upwardly spreads.

In the first embodiment, when the write operation of the adjacent cell in the column direction is terminated, a threshold voltage distribution of an erase cell is judged, and a soft program operation is executed to narrow the threshold voltage distribution of the erase cell when the threshold voltage distribution of the erase cell is larger than a predetermined value.

(Soft Program Operation)

Thus, after the adjacent cell in the column direction is subjected to a program operation (S16), data is transferred between the DDC, the TDC and the PDC as described above, and the low level is set with respect to the PDC as write data.

In this state, whether data in the memory cell MC0 is "0" and a threshold voltage is lower than a verify voltage "z" is verified (S19). This verify operation is the same as the program verify operation. As a result of this verify operation, when the threshold voltage of the memory cell MC0 is lower than the verify voltage "z", a write operation is executed until the threshold voltage exceeds the verify voltage "z" (S20, S18 and S19).

After the soft program operation, data is written in a first page of a memory cell MC3. When the write operation of the memory cell MC3 which is adjacent to the memory cell MC1 in a bit line direction is terminated, a threshold voltage of the memory cell MC1 is increased due to an FG-FG capacity depending on write data, and a threshold voltage distribution spreads as shown in FIG. 1B. Thus, when data in the memory cell MC1 is "0" and a threshold voltage is lower than the verify voltage "z", the soft program operation is executed with respect to the memory cell MC1 like the memory cell MC0.

Thereafter, data is written in a first page of a memory cell MC4. When the write operation is executed, a threshold voltage of the memory cell MC2 is increased due to an FG-FG capacity depending on write data, and a threshold voltage distribution spreads as shown in FIG. 1B. Thus, when data in the memory cell MC2 is "0" and a threshold voltage is lower than the verify voltage "z", the soft program operation is executed with respect to the memory cell MC2.

Then, data is written in a first page of a memory cell 5. When this write operation is performed, a threshold voltage of the memory cell MC5 is increased due to an FG-FG capacity depending on write data, and a threshold voltage distribution spreads as shown in FIG. 1B. Thus, when data in the memory cell MC3 is "0" and a threshold voltage is lower than the verify voltage "z", the soft program operation is executed with respect to the memory cell MC3. In this soft program operation, data which is not greater than i bits (i<k: $2^k$=n) is written.

Specifically, a potential of a selected word line is set to a potential lower than a regular program voltage Vpgm, a channel of a cell is set to Vss, and data is written. Then, whether a threshold voltage of an erase cell has reached the verify voltage "z" is verified, and the soft program operation is executed until the threshold voltage of the erase cell reaches the verify voltage "z".

After the first page program operation and the soft program operation are terminated in this manner, data for the second page is written in the memory cell MC0.

(Second Page Program Operation)

Figure 9:
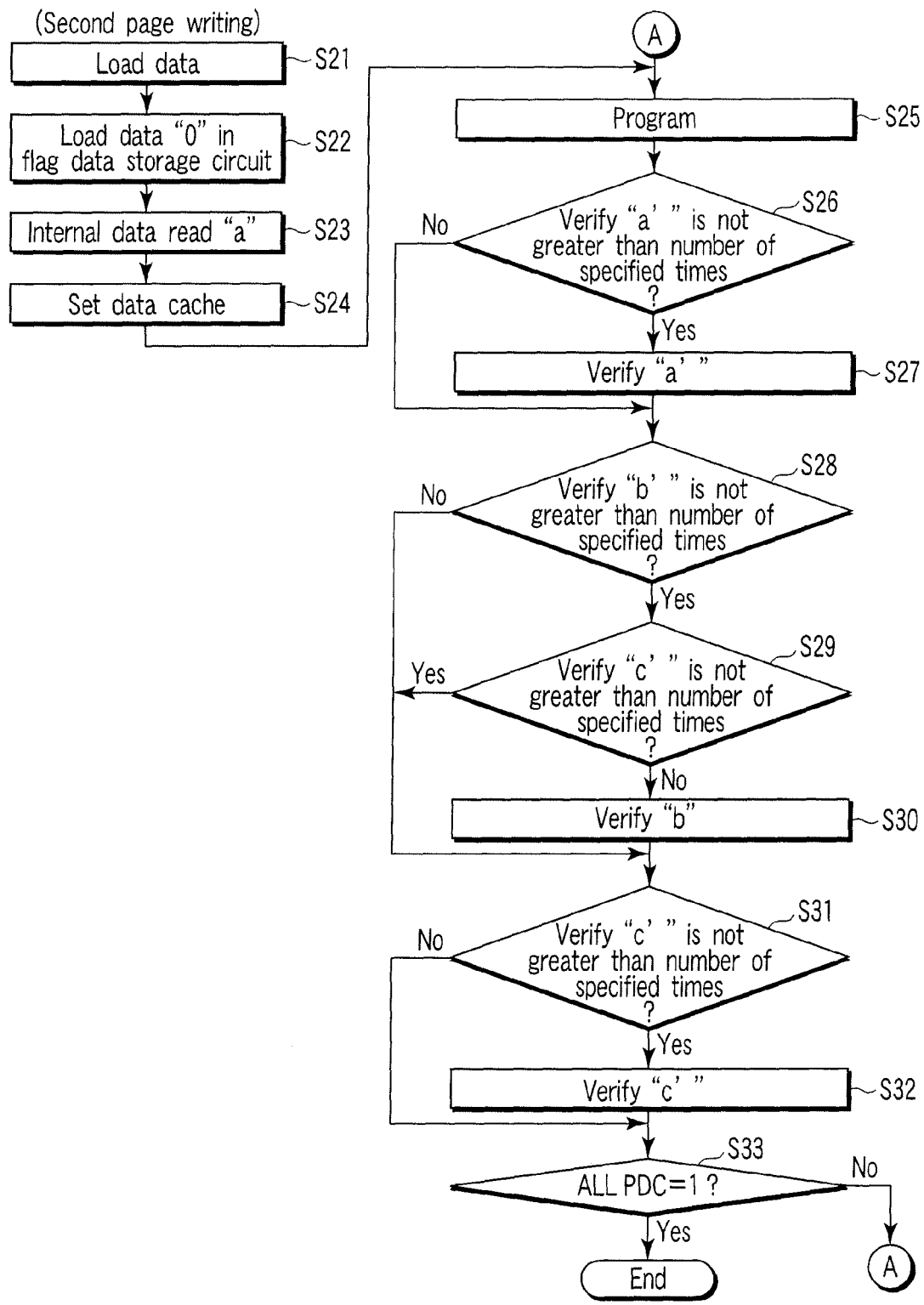
FIG. 9 is a flowchart showing a second page program operation according to the first embodiment.

FIG. 9 shows a second page program operation. In the second page program operation, an address is likewise first specified and two pages shown in FIG. 3 are selected.

Then, data to be written is stored in the SDCs in all the data storage circuits 10 from the outside (S21). The SDC in the data storage circuit 10 shown in FIG. 6 changes to the high level when data "1" (a write operation is not executed) is supplied from the outside, and it changes to the low level when data "0" (a write operation is executed) is input. Subsequently, data "0" is loaded in the flag data storage circuit 10a (S22).

Figure 1D:
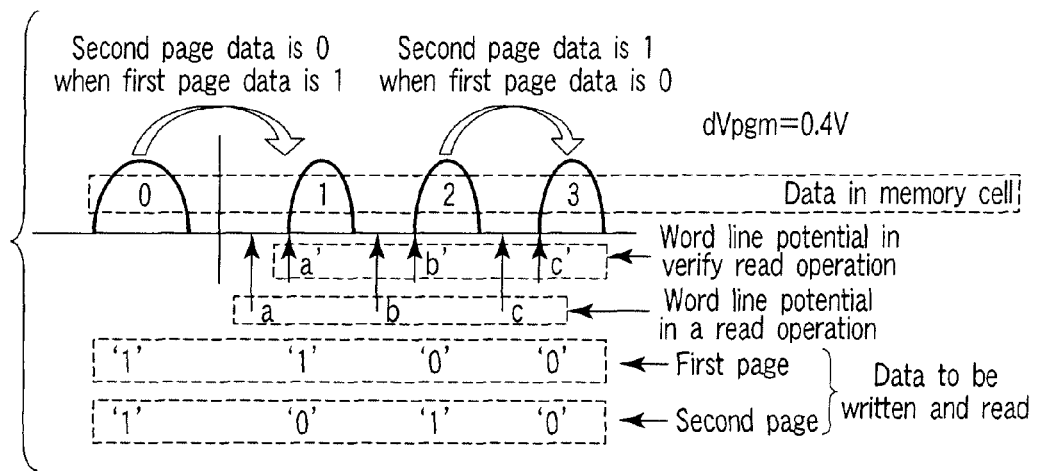
FIG. 1D is a view showing a program operation in the first embodiment.

As shown in FIG. 1D, in the second page program operation, data in a memory cell remains as "0" when data in the memory cell is "0" and data input from the outside is "1", and data in the memory cell is set to, e.g., "1" when data input from the outside is "0". Data in the memory cell is set to, e.g., "2" when data in the memory cell is "2" and data input from the outside is "1", and data in the memory cell is set to, e.g., "3" when data in the memory cell is "2" and data input from the outside is "0".

(Internal Data Read Operation) (S23)

First, before writing data in a cell, an internal read operation is executed in order to judge whether data in the memory cell of a first page is "0" or "2". The internal read operation is completely the same as the read operation, and a potential of a word line is set to "a" to carry out the read operation.

First, a read voltage Vread is supplied to a non-selected word line and the select line SGD in a selected block, a predetermined voltage is supplied to the signal BLPRE and the signal BLCLAMP of the data storage circuit 10 shown in FIG. 6 to pre-charge a bit line, and then the select line SGS on a source side of the cell is set to a high level. When a threshold voltage is higher than the potential "a", the cell is turned off and hence the bit line remains on the high level. When the threshold voltage is lower than the potential "a", the cell is turned on and hence the bit line is set to a ground potential Vss.

Then, a voltage, e.g., Vdd is supplied to the signal VPRE, a voltage, e.g., Vdd+Vth is fed to the signal BLPRE of the data storage circuit 10 to pre-charge the node N3 of the TDC to Vdd, and then a predetermined voltage is supplied to the BLCLAMP. The node N3 of the TDC is set to the low level when a bit line is on the low level, and it is set to the high level when the bit line is on the high level. Then, a potential of the TDC is read into the PDC. The high level is latched in the PDC when data in the memory cell is "2", and the low level is latched in the PDC when data in the memory cell is "0".

(Data Cache Setting) (S24)

Subsequently, each data cache is set based on data from the outside and a result of the internal data read operation. Data stored in the SDC from the outside and data stored in the TDC by the internal read operation are operated by using the PDC and DDC, thereby generating data which is used to write data in a second page.

That is, when setting data in a memory cell to "0" (in the case of data "1" in the first page and data "1" in the second page), the PDC, the DDC and the SDC are all set to the high level.

When setting data in a memory cell to "1" (in the case of data "1" in the first page and data "0" in the second page), the PDC is set to the low level, the DDC is set to the low level and the SDC is set to the high level.

When setting data in a memory cell to "2" (in the case of data "0" in the first page and data "1" in the second page), the PDC is set to the low level, the DDC is set to the high level and the SDC is set to the low level.

When setting data in a memory cell to "3" (in the case of data "0" in the first page and data "0" in the second page), the PDC, the DDC and the SDC are all set to the low level.

(Program Operation) (S25)

A program operation is completely the same as the program operation of the first page, and writing is not carried out when data "1" is stored in the PDC. When data "0" is stored, writing is executed.

(Second Page Verify Operation) (S26 to S33)

A program verify operation is executed like the verify operation of the first page. A potential supplied to a selected word line is "a'", "b'" or "c'" as shown in FIG. 1D. The number of times of verify operation at each verify potential is set in advance, and a predetermined verify operation is executed in accordance with each number of times of verify operation. In this manner, an unnecessary verify operation is skipped, and the program verify operation of the second page is performed. When the program operation of the second page is executed, such a threshold voltage distribution as shown in FIG. 1D is obtained.

Figure 1E:
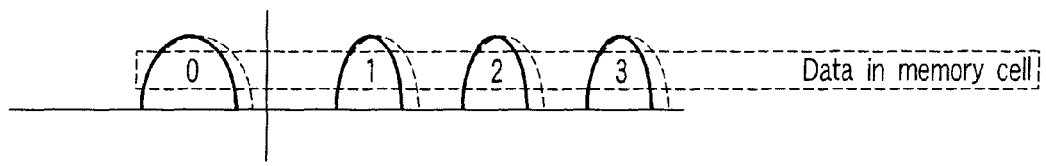
FIG. 1E is a view showing a program operation in the first embodiment.

Then, when second page data is written in an adjacent cell, a threshold voltage distribution of a memory cell spreads toward a higher voltage side in accordance with this write operation as shown in FIG. 1E. A potential supplied to a word line in a data read operation is set to have a substantially intermediate value of these respective threshold voltages.

It is to be noted that a program voltage Vpgm is gradually increased when writing data in a memory cell. This increment dVpgm is, e.g., 0.6V in the case of the first page write operation, or 0.4V in the case of the second page write operation.

According to the first embodiment, in a case where first page data and second page data are sequentially written in each half of memory cells connected with word lines, when data in a precedently written memory cell is "0" after writing the first page data in an adjacent cell in a column direction, the soft program operation which writes data which is not greater than i bits (i<k: $2^k$=n) in this memory cell is executed. Therefore, even when a threshold voltage of an erase cell is expanded due to writing data in the adjacent cell, writing is executed to increase the threshold voltage and narrow the threshold voltage distribution by the soft program operation. Therefore, in the second page data write operation, a shift amount from data "0" to data "1" of a memory cell can be reduced, and shifting from data "0" to data "1" of a memory cell can be set substantially equal to shifting from data "2" to "3" of a memory cell. Therefore, a fluctuation in each data threshold voltage can be set to substantially ideal 1/3 of four values.

Further, when writing data "1", there is a problem that a threshold voltage of an erase cell is increased due to program disturbance, but a threshold voltage of an erase cell is increased by the soft program operation after writing first page data. Therefore, the threshold voltage of the erase cell can be set low before writing the first page data, and an erase state can be maintained even if the threshold voltage is increased due to program disturbance.

Second Embodiment

A second embodiment will now be described.

In the first embodiment, data is collectively written in a half of cells each having a pair of bit lines connected with the data storage circuit 10 and being aligned in a row (a word line) direction. On the other hand, in the second embodiment, data is collectively written in all cells aligned in the row direction.

Figure 10:
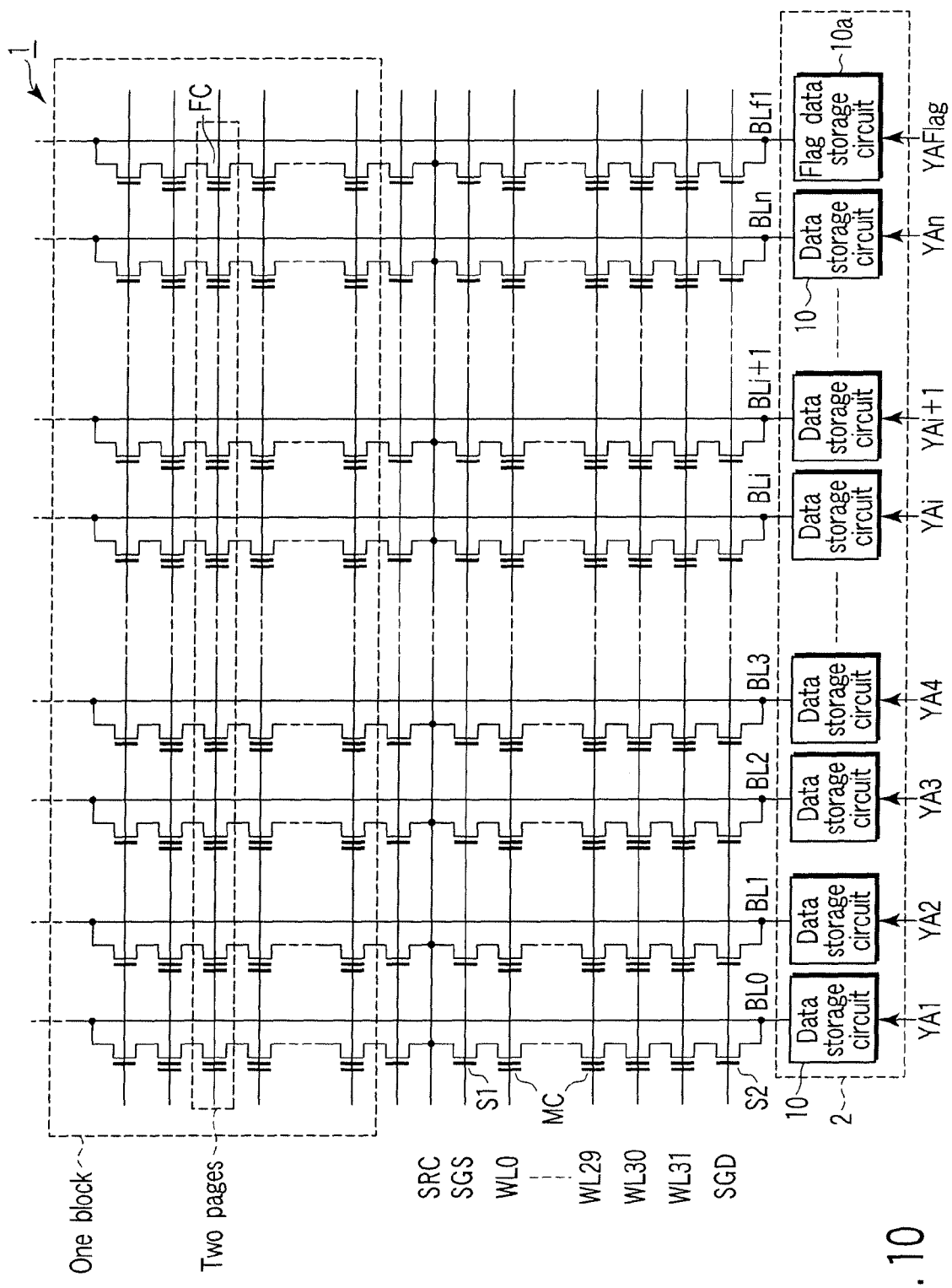
FIG. 10 is a circuit diagram showing an example of a memory cell array and data storage circuits applied to a second embodiment.

FIG. 10 shows an example of a memory cell array and data storage circuits applied to the second embodiment. In FIG. 10, each bit line is connected to a corresponding data storage circuit 10 or 10a. A configuration of the data storage circuit 10 or 10a is substantially the same as that shown in FIG. 6. However, there are not transistors 61v and 61w which select bit lines, and each bit line is directly connected to a transistor 61t.

Figure 11:
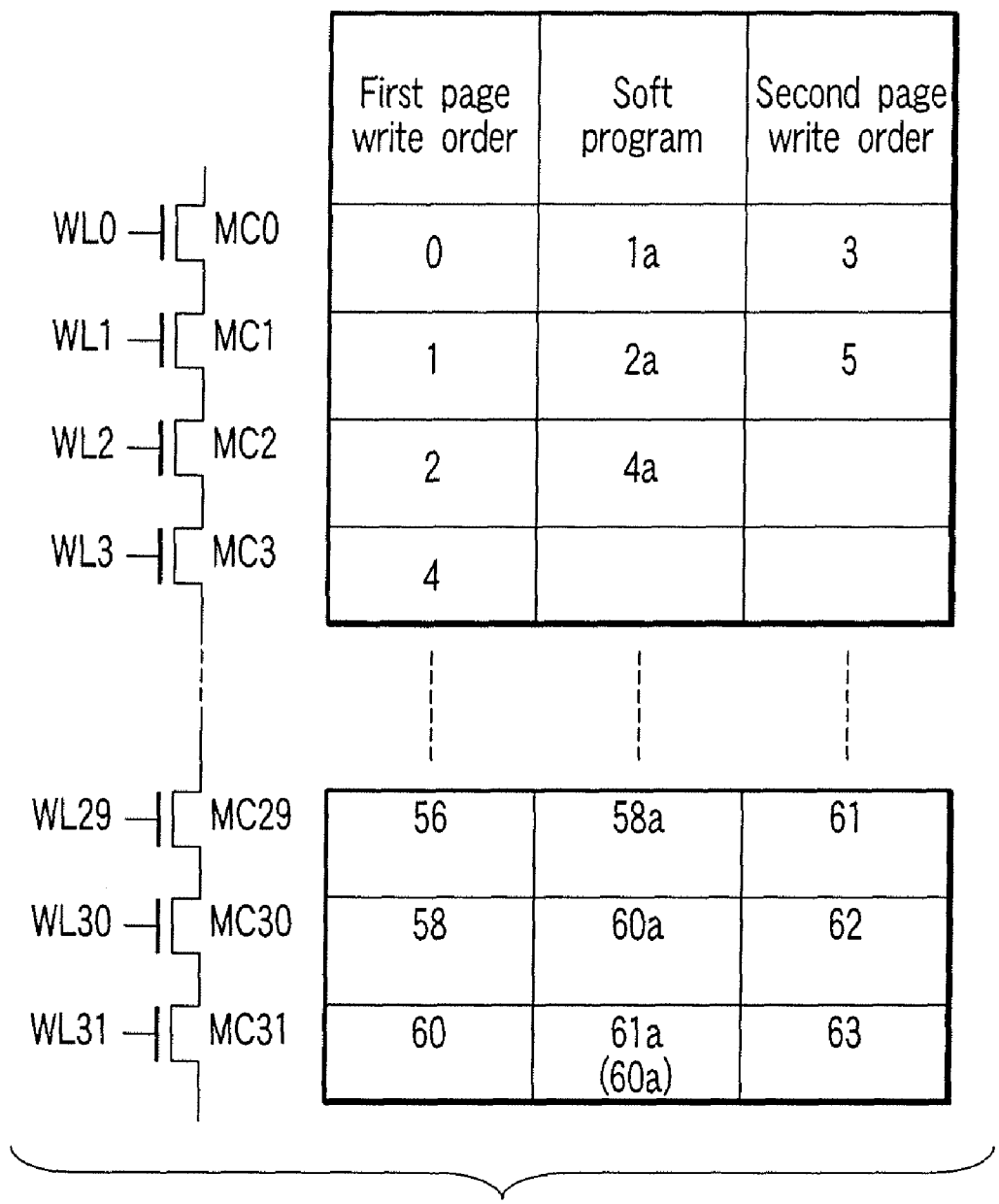
FIG. 11 is a view showing a write order according to the second embodiment.

FIG. 11 is a write order according to the second embodiment.

In a zeroth write operation, one-bit data is written in a first page of a memory cell MC0.

In a first write operation, one-bit data is written in a first page of a memory cell MC1 adjacent to the memory cell MC0 in a column direction.

Then, in a 1ath write operation, when data in the memory cell MC0 is "0" and a threshold voltage is lower than "z" as shown in FIG. 1, a soft program operation is executed until the threshold voltage exceeds "z".

In a second write operation, one-bit data is written in a first page of a memory cell MC2 adjacent to the memory cell MC1 in the column direction.

Then, in a 2ath write operation, when data in the memory cell MC1 is "0" and a threshold voltage is lower than "z" as shown in FIG. 1, the soft program operation is executed until the threshold voltage exceeds "z".

In a third write operation, one-bit data is written in a second page of the memory cell MC0.

In a fourth write operation, one-bit data is written in a first page of a memory cell MC3 adjacent to the memory cell MC2 in the column direction.

Then, in a 4ath write operation, when data in the memory cell MC2 is "0" and a threshold voltage is lower than "z", the soft program operation is executed until the threshold voltage exceeds "z".

In a fifth write operation, one-bit data is written in a second page of the memory cell MC1.

Then, data is likewise sequentially written in memory cells.

Here, after a 61st write operation, in a 61ath operation, when a threshold voltage of data "0" in a memory cell MC31 is lower than "z", the soft program operation is executed until the threshold voltage exceeds "z". Alternatively, after a 60th write operation, when a threshold voltage of data "0" in the memory cell MC31 is lower than "z", the soft program operation is executed until the threshold voltage exceeds "z".

According to the second embodiment, when a threshold voltage of data "0" in an erase cell on a front side in the column direction is lower than "z" after writing data in an adjacent memory cell in the column direction, the soft program is executed until the threshold voltage exceeds "z". Therefore, even when a threshold voltage distribution of the erase cell spreads due to writing data in the adjacent cell, the threshold voltage distribution can be narrowed toward a higher voltage side by the soft program operation. Therefore, when writing second page data, a shift amount from data "0" to data "1" can be reduced, and hence a fluctuation in a threshold voltage after writing the second page data can be set to substantially ideal 1/3 of four values.

Third Embodiment

The description has been given as to the case where four-valued data is stored in one memory cell in conjunction with the first and second embodiments. On the other hand, according to a third embodiment, eight-valued data is stored in one memory cell.

FIG. 12 shows an example of a memory cell array and data storage circuits applied to the third embodiment. This example is a case where data is collectively written in a half of memory cells connected with word lines like the first embodiment. Therefore, a pair of bit lines are connected to each data storage circuit 10. Further, four flag cells FC1, FC1, FC2 and FC2 are connected to each word line. A pair of bit lines BLf1 and BLf2 to which these flag cells FC1, FC1, FC2 and FC2 are connected are connected to a first flag data storage circuit 10a, and bit lines BLf3 and BLf4 are connected to a second flag data storage circuit 10b. A configuration of each of the data storage circuit 10a and the first and second flag data storage circuits 10a and 10b is the same as that of the circuit depicted in FIG. 6.

Figure 13A:
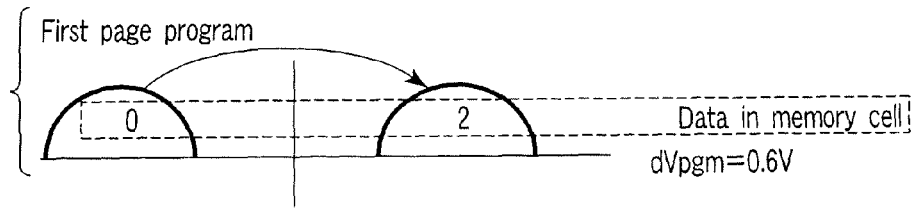
FIG. 13A is a view showing an operation when writing eight-valued data.
Figure 13B:
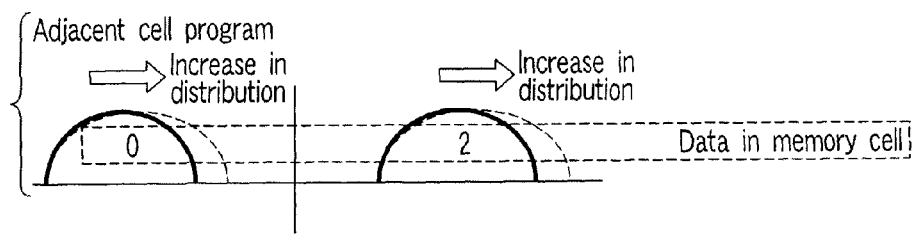
FIG. 13B is a view showing an operation when writing eight-valued data.

FIGS. 13A to 13G show operations when writing eight-valued data. FIG. 13A shows a first page data write operation, and FIG. 13B shows a write operation in an adjacent cell. These write operations are the same as the four-valued data write operation. An increment dVpgm of a program voltage Vpgm when writing first page data is, e.g., 0.6V. In the case of the four-valued data write operation described in conjunction with the first and second embodiments, first page data is written in an adjacent cell, and then the soft program operation is executed.

Figure 13C:
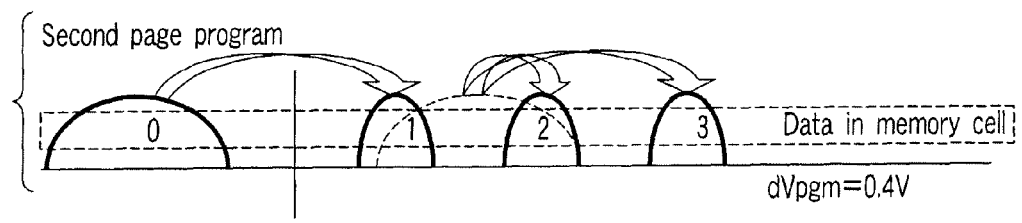
FIG. 13C is a view showing an operation when writing eight-valued data.
Figure 13D:
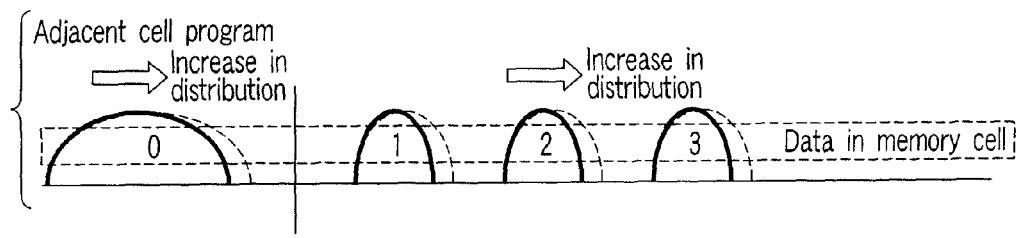
FIG. 13D is a view showing an operation when writing eight-valued data.

On the other hand, in the case of eight values, as shown in FIG. 13C, second page data is written. An increment dVpgm of the program voltage Vpgm when writing second page data is, e.g., 0.4V. Then, as shown in FIG. 13D, data is written in an adjacent cell. As a result, a threshold voltage distribution of the second page data spreads.

Figure 13E:
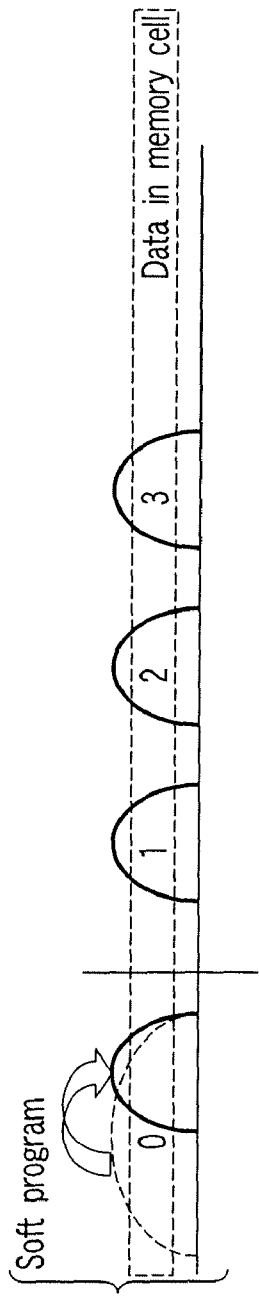
FIG. 13E is a view showing an operation when writing eight-valued data.

Thereafter, as shown in FIG. 13E, when data in a cell is "0", the soft program operation is executed until a verify voltage "z" is exceeded.

Figure 13F:
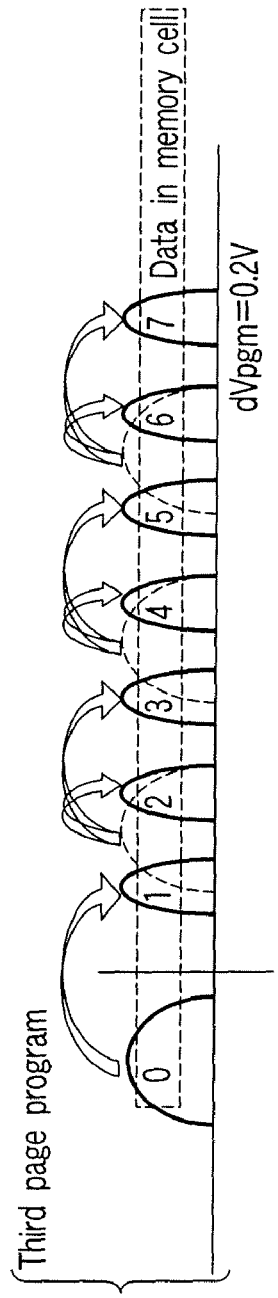
FIG. 13F is a view showing an operation when writing eight-valued data.
Figure 13G:
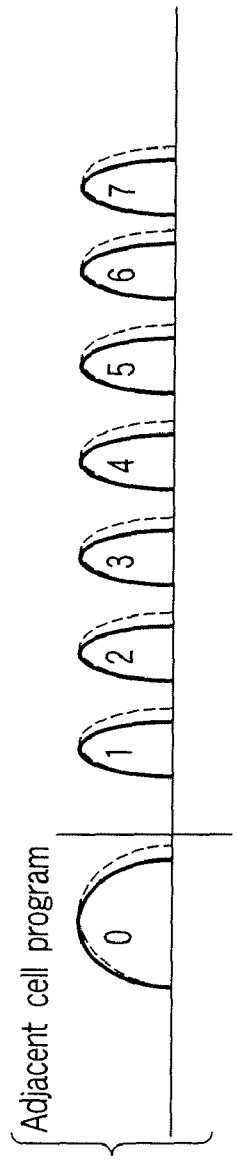
FIG. 13G is a view showing an operation when writing eight-valued data.

Subsequently, as shown in FIG. 13F, third page data is written, and threshold voltages for eight values are set. An increment dVpgm of the program voltage Vpgm when writing third page data is, e.g., 0.2V. Then, a program operation for an adjacent cell is executed, and threshold voltage distributions of eight values spreads in accordance with execution of this operation as shown in FIG. 13G.

Figure 14:
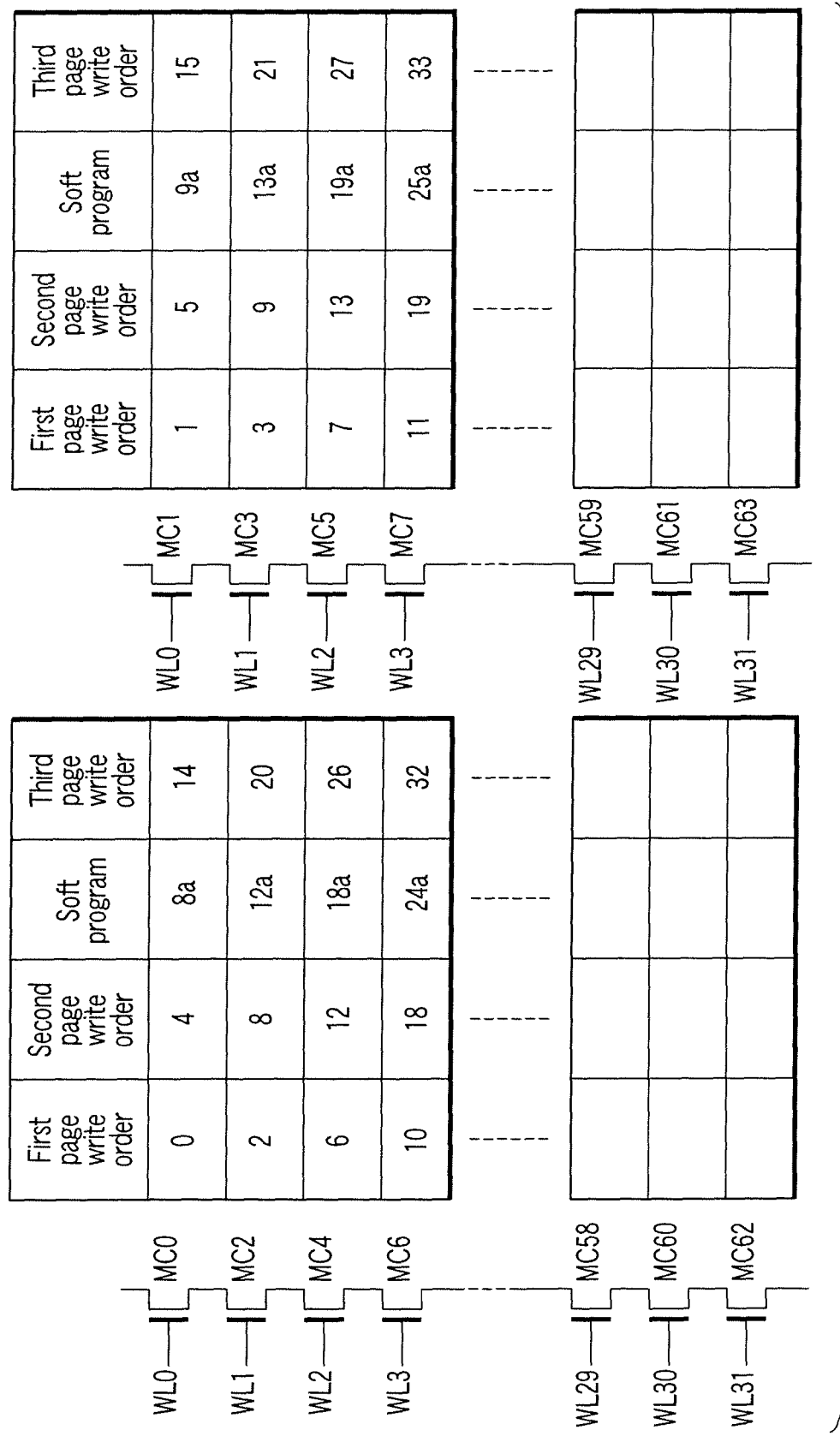
FIG. 14 is a view showing a write order of memory cells in a third embodiment.

FIG. 14 shows a write order of memory cells in the third embodiment. FIG. 14 illustrates a case where data is collectively written with respect to a half of memory cells selected by word lines.

In a zeroth write operation, first page data is written in a memory cell MC0.

In a first write operation, first page data is written in a memory cell MC1 adjacent to the memory cell MC0 in a row direction.

In a second write operation, first page data is written in a memory cell MC2 adjacent to the memory cell MC0 in a column direction.

In a third write operation, first page data is written in a memory cell MC3 adjacent to the memory cell MC1 in the column direction.

In a fourth write operation, second page data is written in a memory cell MC0.

In a fifth write operation, second page data is written in a memory cell MC1 adjacent to the MC0 in the row direction.

In a sixth write operation, first page data is written in a memory cell MC4 adjacent to the memory cell MC2 in the column direction.

In a seventh write operation, first page data is written in a memory cell MC5 adjacent to the memory cell MC3 in the column direction.

In an eighth write operation, second page data is written in the memory cell MC2 adjacent to the memory cell MC0 in the column direction.

In an 8ath write operation, when data in the memory cell MC0 is "0" and a threshold voltage is lower than a verify voltage "z", the soft program operation is executed until the threshold voltage of the memory cell MC0 exceeds the verify voltage "z".

In a ninth write operation, second page data is written in the memory cell MC3 adjacent to the memory cell MC1 in the column direction.

In a 9ath write operation, when data in the memory cell MC1 is "0" and a threshold voltage is lower than the verify voltage "z", the soft program operation is executed until the threshold voltage of the memory cell MC1 exceeds the verify voltage "z".

Thereafter, data is likewise sequentially written.

Figure 15:
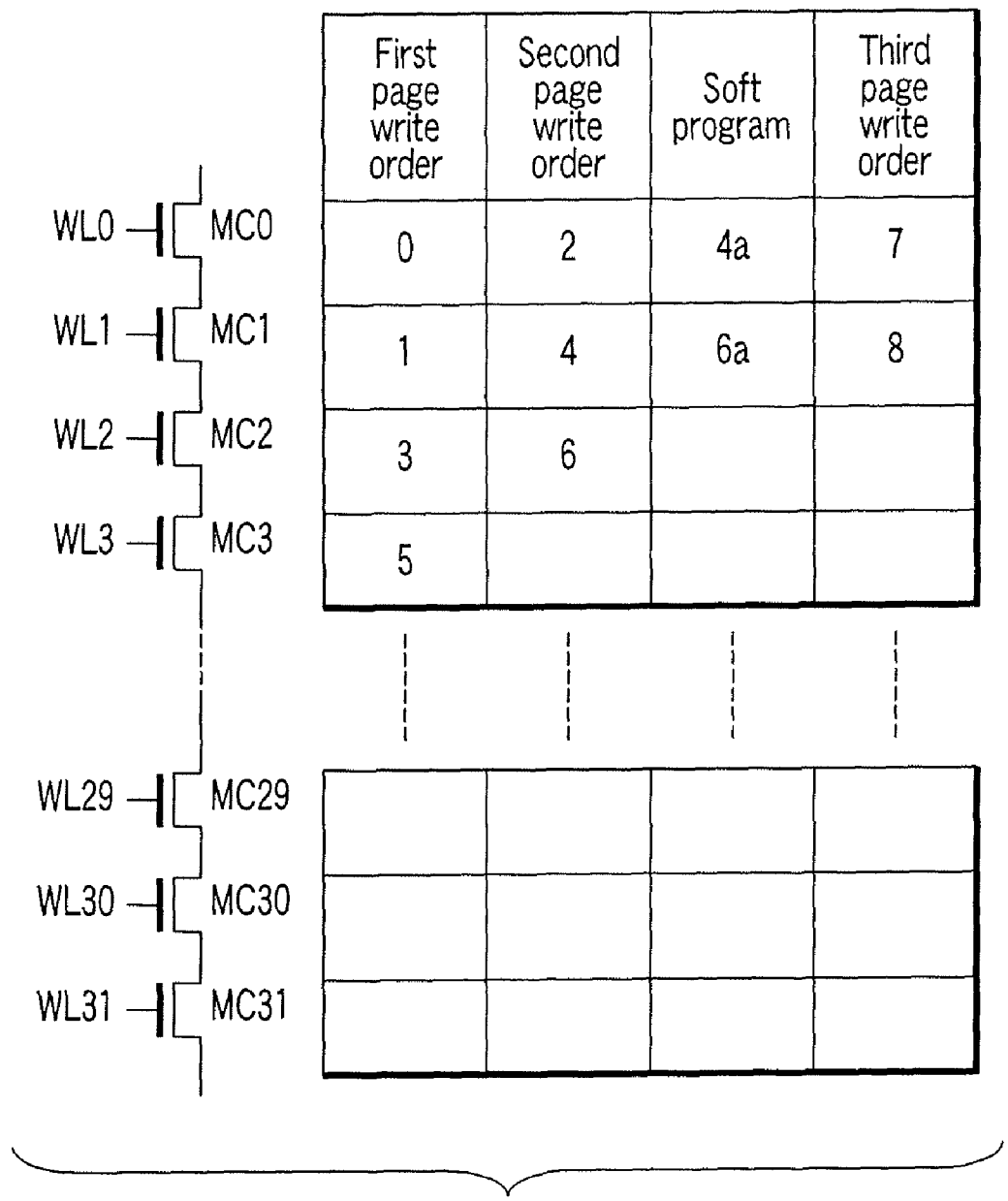
FIG. 15 is a view showing an order when collectively writing data in all memory cells connected with word lines.
Figure 16A:
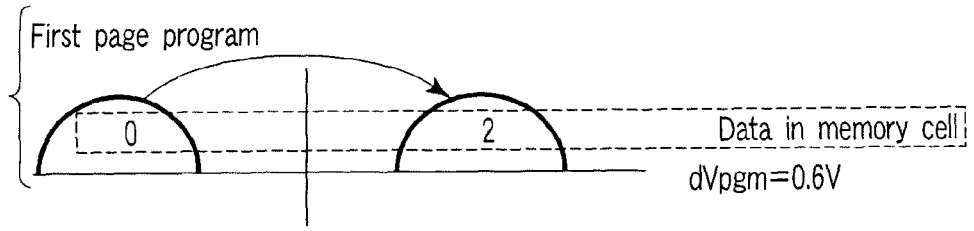
FIG. 16A is a view showing a program operation for eight-valued data in a fourth embodiment.
Figure 16B:
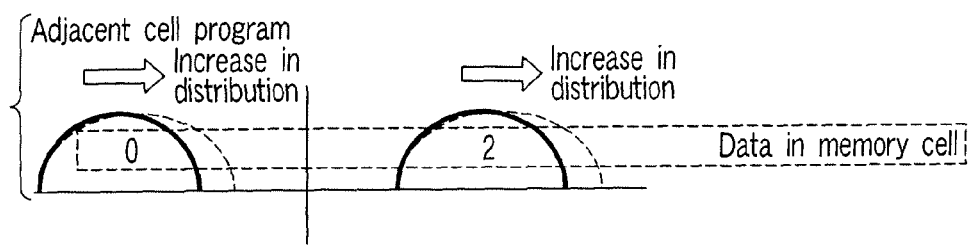
FIG. 16B is a view showing a program operation for eight-valued data in the fourth embodiment.
Figure 16C:
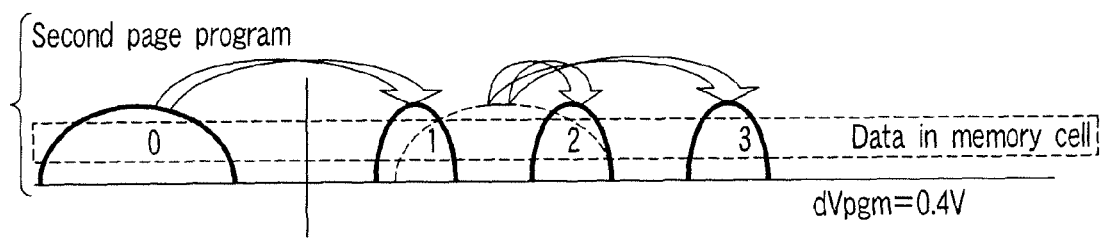
FIG. 16C is a view showing a program operation for eight-valued data in the fourth embodiment.
Figure 16D:
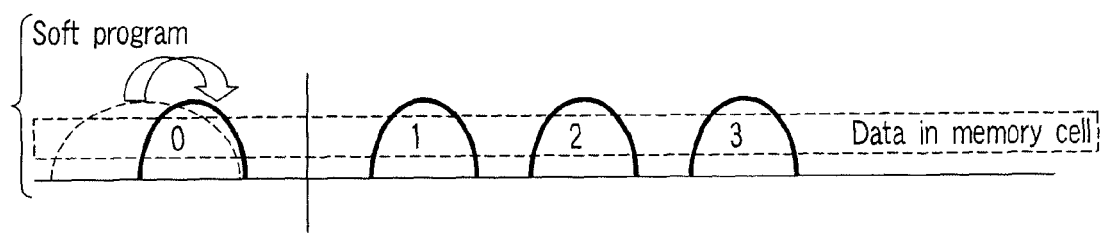
FIG. 16D is a view showing a program operation for eight-valued data in the fourth embodiment.
Figure 16E:
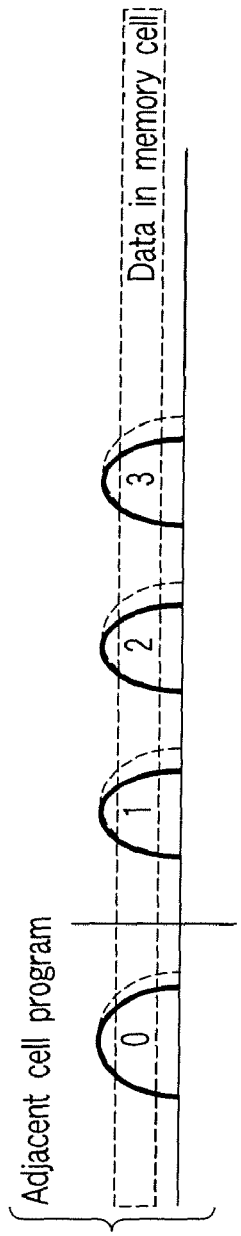
FIG. 16E is a view showing a program operation for eight-valued data in the fourth embodiment.
Figure 16F:
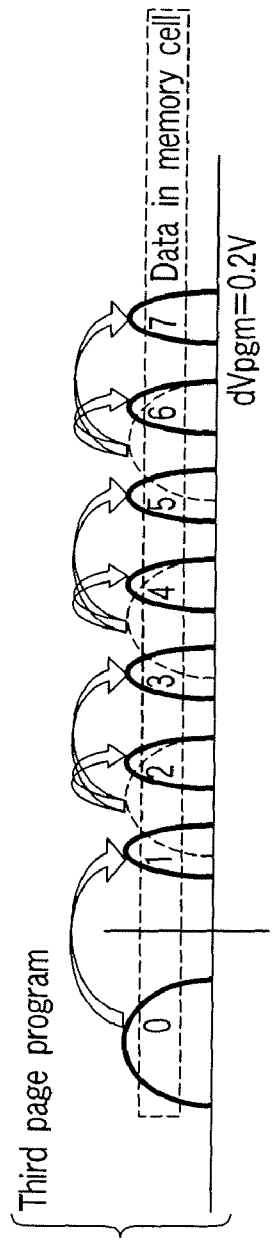
FIG. 16F is a view showing a program operation for eight-valued data in the fourth embodiment.
Figure 16G:
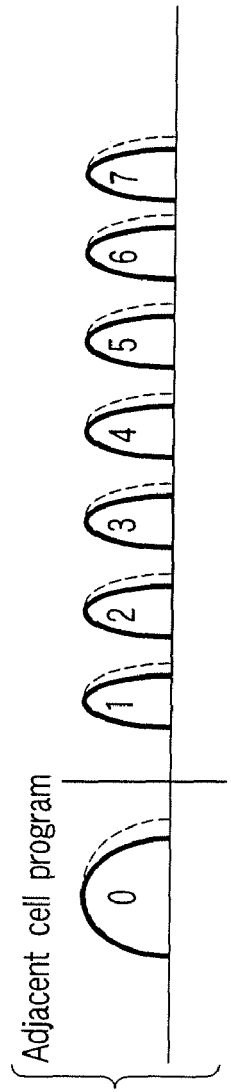
FIG. 16G is a view showing a program operation for eight-valued data in the fourth embodiment.

FIG. 15 shows an order of collectively writing data in all memory cells connected with word lines. In a circuit configuration of this example, the data storage circuit 10 is connected to each bit line as shown in FIG. 10, and four bit lines connected with a flag cell depicted in FIG. 12 are connected with non-illustrated two flag data storage circuits. As shown in FIG. 15, for example, second page data is written in the memory cell MC0 and the memory cell MC1 adjacent to this memory cell MC0 in a bit line direction. Then, when data in the memory cell MC0 is "0", the soft program operation is executed until a threshold voltage exceeds the verify voltage "z". Then, third page data is written in the memory cell MC0.

According to the third embodiment, in the case of storing eight-valued data and sequentially writing data in a half of memory cells connected with word lines, when data in a memory cell in which the data has been precedently written is "0" after second page data is written in a cell adjacent in a bit line direction, the soft program operation of writing data which is not greater than i bits (i<k: $2^k$=n) is executed with respect to this memory cell. Therefore, even if a threshold voltage of an erase cell has spread due to writing data in an adjacent cell, the soft program operation performs writing to increase the threshold voltage and narrow a threshold voltage distribution. Therefore, in writing third page data, a shift amount from data "0" to data "1" of a memory cell can be reduced. Accordingly, a fluctuation in a threshold voltage of each data can be set to a substantially ideal 1/7 of eight values.

Fourth Embodiment

A fourth embodiment will now be described. In a semiconductor memory device storing eight-valued data, when writing third page data has failed, second page data and first page data are also destroyed. Therefore, it is often the case that a user stores the second and first page data in an external storage unit until writing the third page data is finished. However, in the third embodiment shown in FIG. 14, all write operations of, e.g., a memory cell MC6 are not completed unless writing third page data is completed in a 32nd write operation after first page data is written in a 10th write operation. Therefore, in order to store data in this period, a random access memory (RAM) having a storage capacity corresponding to 23 pages is required.

FIG. 16 shows a program operation for eight-valued data in the fourth embodiment. In the case of the third embodiment shown in FIG. 13, the program operation is executed with respect to an adjacent cell after the second page program operation, and then the soft program operation is performed. On the other hand, in the program operation according to the fourth embodiment, the soft program operation is executed as shown in FIG. 16D after the second page program operation depicted in FIG. 16C. Subsequently, as shown in FIG. 16E, the program operation is performed with respect to an adjacent cell, and the third page program operation is carried out as shown in FIG. 16F.

Figure 17:
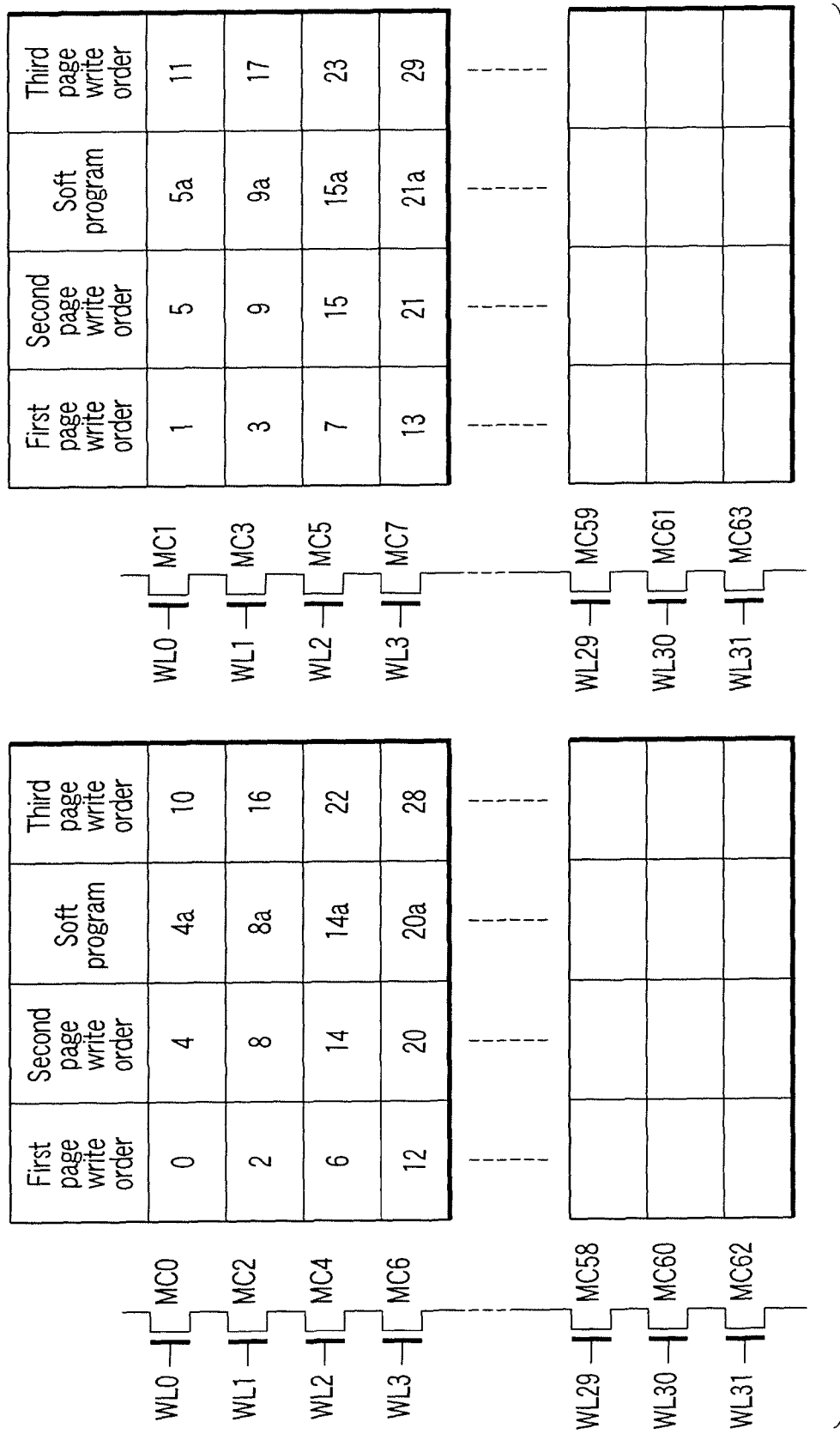
FIG. 17 is a view showing an order when collectively writing data in each half of memory cells connected with word lines in the fourth embodiment.

FIG. 17 shows an order of collectively writing data in each half of memory cells connected to word lines in the fourth embodiment. In the case of the fourth embodiment depicted in FIG. 17, first page data is written in a memory cell MC in a 12th write operation, and third page data is written in the same in a 28th write operation. Therefore, it is good enough for the RAM which holds data outside the device to have a storage capacity corresponding to 17 pages.

Figure 18:
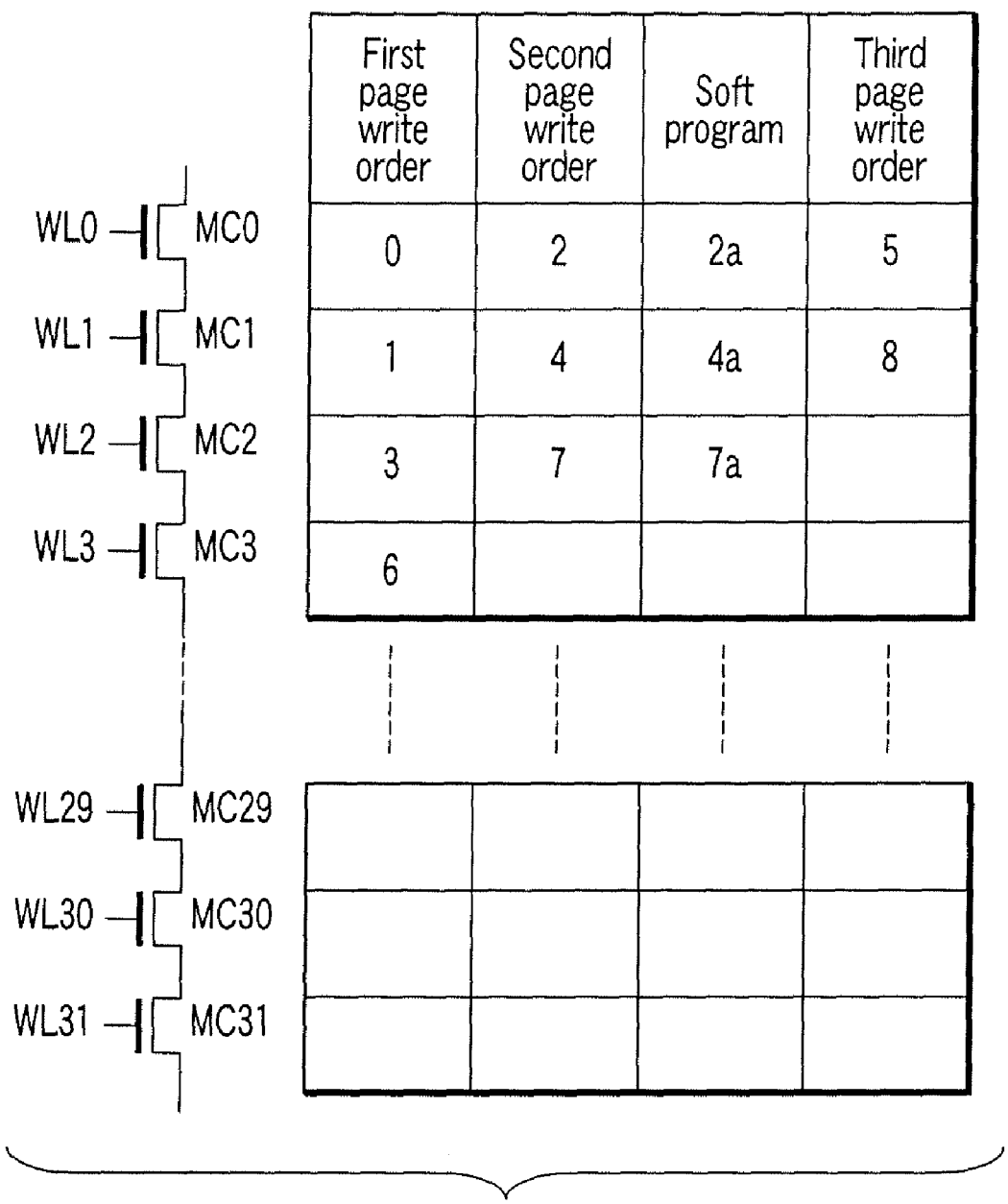
FIG. 18 is a view showing a case where data is collectively written in all memory cells connected with word lines.

FIG. 18 shows a case where data is collectively written in all memory cells connected with word lines. In this case, paying attention to, e.g., a memory cell MC1, first page data is written in a first write operation, and writing third page data is completed in an eighth write operation. Therefore, it is good enough for the RAM which holds data outside the device to have a storage capacity corresponding to eight pages, whereby the storage capacity of the RAM can be further reduced.

In this manner, according to the fourth embodiment, the soft program operation is executed after the second page program operation, and then the program operation and the third page program operation are executed with respect to an adjacent cell. Therefore, steps from the first page program operation to the third page program operation can be decreased as compared with the third embodiment. Thus, according to the fourth embodiment, it is possible to greatly reduce the storage capacity of the RAM which holds data outside the device as compared with the third embodiment.

Fifth Embodiment

The first to fourth embodiments are the example in which a change in a threshold voltage distribution by the program operation of an adjacent cell is suppressed to an ideal value. In the case of a write method which self-boosts a threshold voltage of a cell in an erased area (erased area self boost), a threshold voltage of an erase cell must be reduced.

The erased area self boost write method will be first described. According to this write method, data must be written from a cell on a source side.

Figure 19:
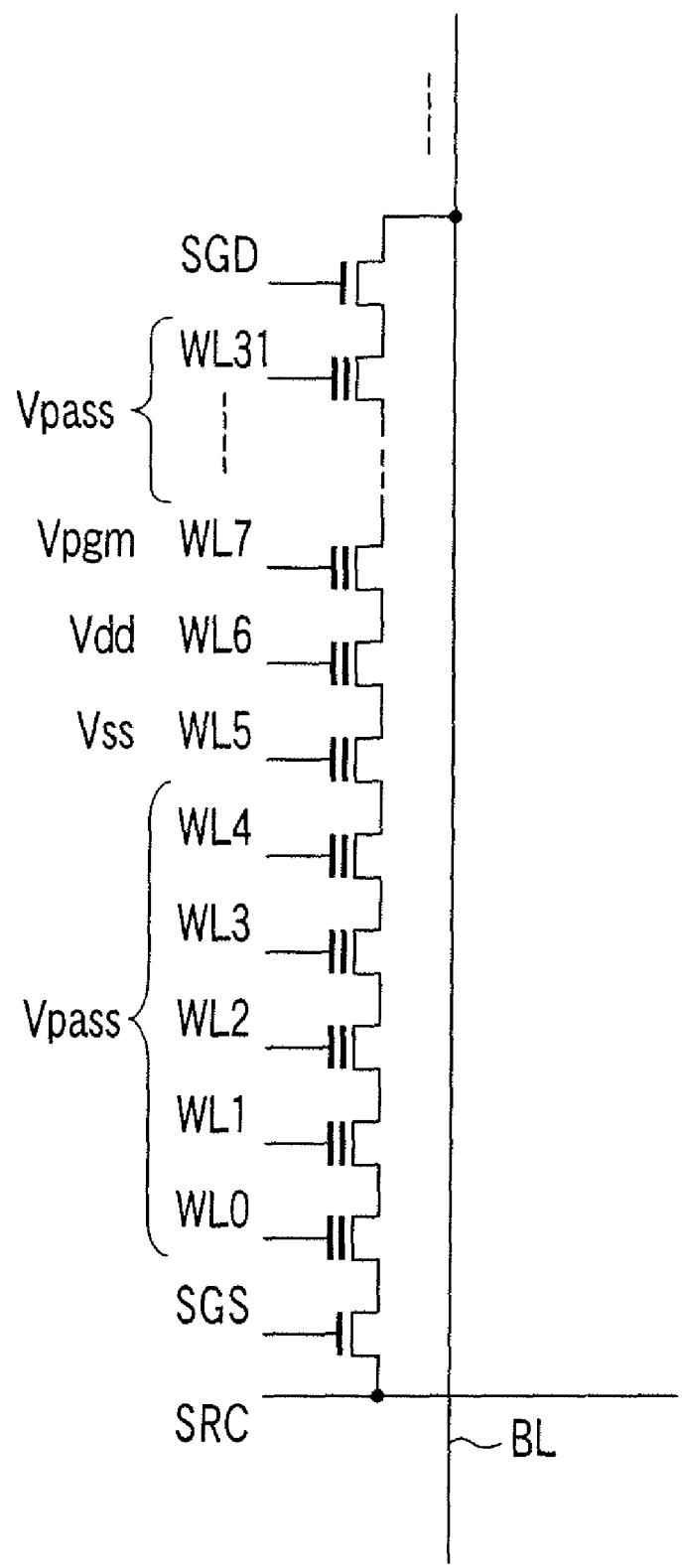
FIG. 19 is a view illustrating an erased area self boost write method.

In FIG. 19, a potential Vss is supplied to a bit line BL in the case of writing, and a potential Vdd is supplied to the same in the case of non-writing. Then, in the case of writing data in a cell connected with, e.g., a word line WL7, a potential Vpass is supplied to word lines WL0 to WL4, a potential Vss is supplied to a word line WL5, a potential Vdd is supplied to WL6, a potential Vpgm is supplied to WL7, and a potential Vpass is supplied to WL8 to WL31, respectively. Here, in the case of writing, a potential of the word line WL7 becomes Vpgm, a channel of the same has a potential Vss, and data is written in a cell connected to this word line. On the other hand, in the case of non-writing, a channel potential is boosted to be, e.g., Vpass/2. However, in NAND cells, when the number of cells in which data has been written is large, channels are hard to be boosted. However, according to the erased area self boost write method, data is necessarily written from the source side. Therefore, when a potential of the word line WL5 is set to Vss and boosting is effected, since data in cells connected to the word lines WL4 to WL31 are erased, channels are boosted to avoid writing. An electric charge must be prevented from moving to cells in which data has been already written as described above and, when a cell connected to the word line WL5 is in an erased state and its threshold voltage is deep (Vth<<0V), it is not turned off. Therefore, it is necessary to shallow (Vth<0V) a threshold voltage of an erase cell.

FIGS. 20A to 20C and FIG. 21 show a write order according to the fifth embodiment. When data is written in accordance with this write order, a threshold voltage of an erase cell can be shallowed.

Figure 20A:
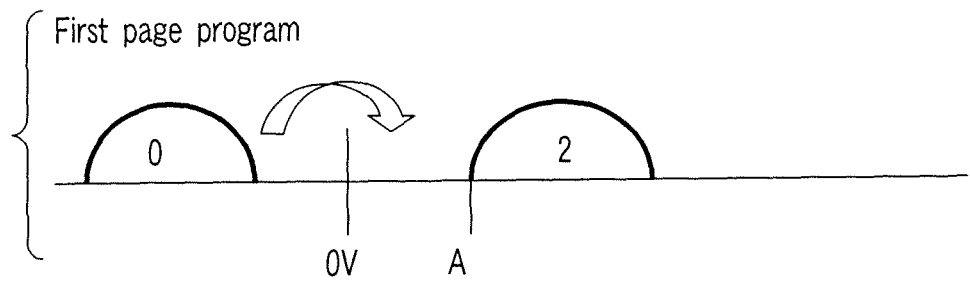
FIG. 20A is a view showing a program operation according to a fifth embodiment.

As shown in FIGS. 20A and 21, in the first page program operation, writing is carried out from data "0" of a memory cell to data "2" of the memory cell in the case of writing, and data in the memory cell is maintained as "0" in the case of non-writing.

Figure 20B:
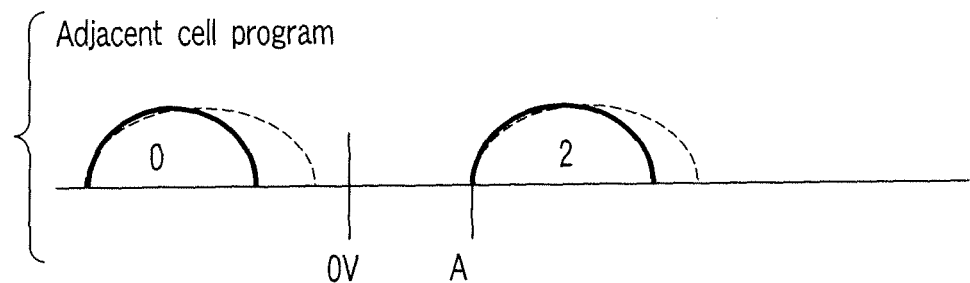
FIG. 20B is a view showing a program operation according to the fifth embodiment.

Then, as shown in FIGS. 20B and 21, data is written in a memory cell adjacent to the memory cell 1 in a bit line direction.

Figure 20C:
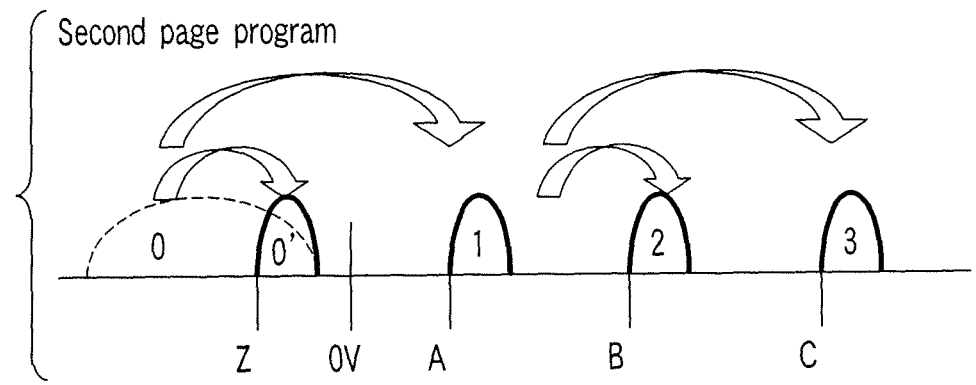
FIG. 20C is a view showing a program operation according to the fifth embodiment.

Subsequently, as shown in FIGS. 20C and 21, in writing second page data in a memory cell 1, when data in the memory cell 1 is "0" and writing is executed, the memory cell 1 is subjected to the program operation from data "0" to data "1". Further, in the case of non-writing, the memory cell 1 is subjected to the program operation from data "0" to data "0'". When data in the memory cell 1 is "1" and writing is executed, the memory cell 1 is subjected to the program operation from data "2" to data "3". When writing is not performed, the memory cell 1 is subjected to the program operation from data "2" to data "2'" of a memory cell.

According to the fifth embodiment, a threshold voltage of an erase cell can be set shallow, and hence the program operation can be assuredly executed from a cell on a source line side after collectively erasing data in cells in a block.

It is to be noted that FIG. 21 shows a write order with respect to memory cells in one NAND cell. However, the present invention is not restricted to FIG. 21, and a write order can be set with respect to memory cells constituting two NAND cells adjacent to each other as shown in FIG. 22. The same effects as those of the fifth embodiment can be obtained even if such an order is adopted.

Figure 23A:
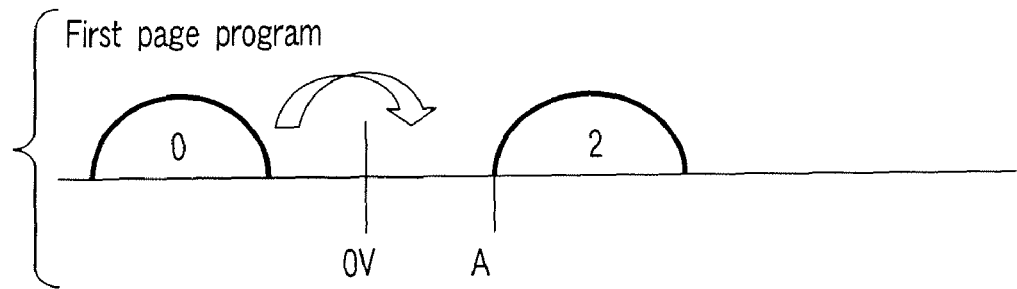
FIG. 23A is a view showing a program operation according to the modification of the fifth embodiment.
Figure 23B:
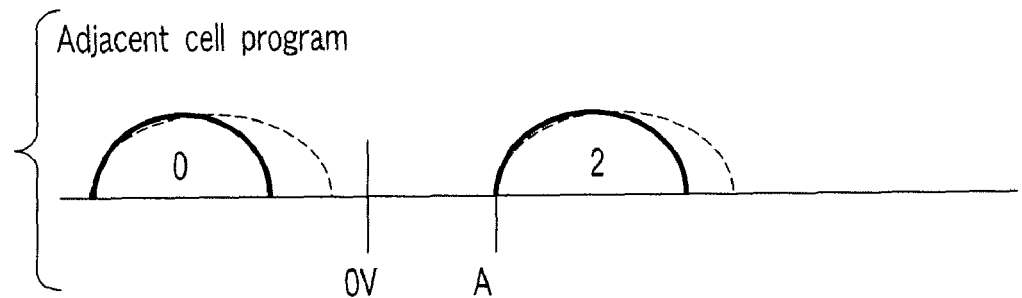
FIG. 23B is a view showing a program operation according to the modification of the fifth embodiment.
Figure 23C:
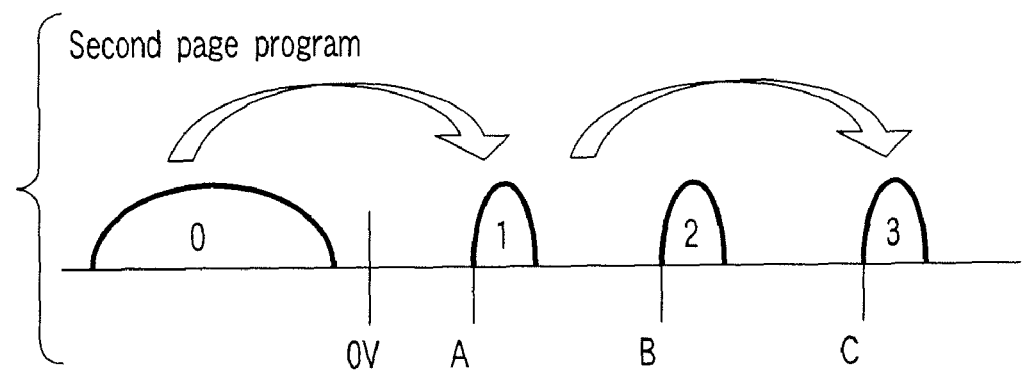
FIG. 23C is a view showing a program operation according to the modification of the fifth embodiment.
Figure 23D:
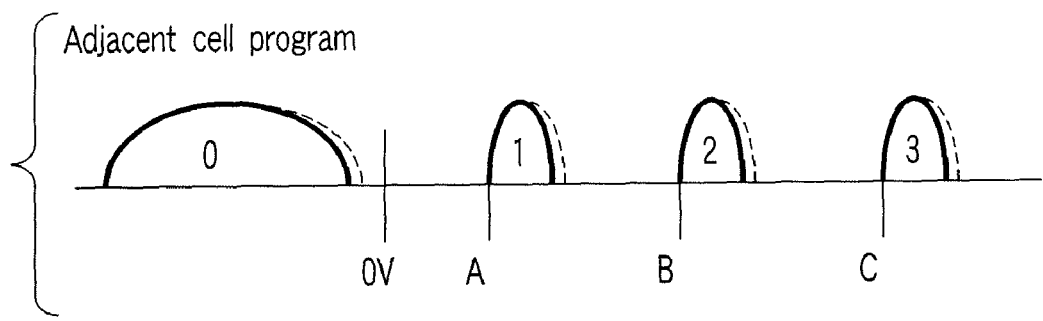
FIG. 23D is a view showing a program operation according to the modification of the fifth embodiment.
Figure 23E:
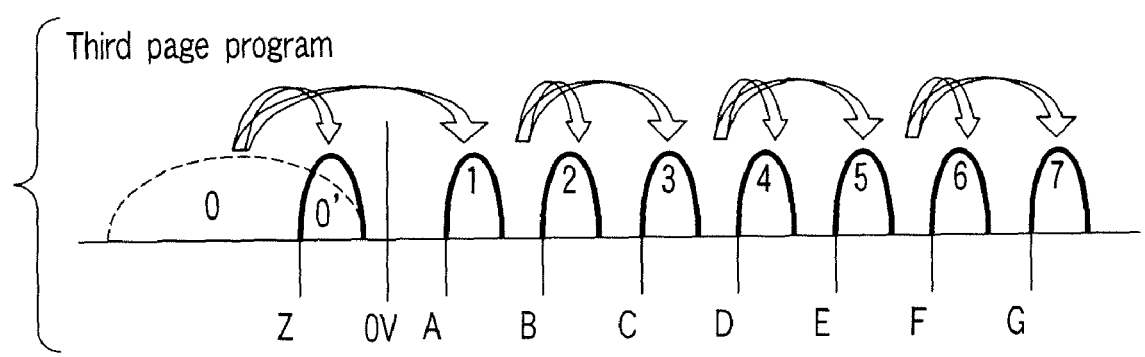
FIG. 23E is a view showing a program operation according to the modification of the fifth embodiment.

Additionally, FIG. 20 shows an example of four values, but this example can be applied to a case where eight-valued data is stored as shown in FIGS. 23A to 23E. Operations in FIGS. 23A to 23C are the same as those of four values. After the program operation is executed with respect to an adjacent cell in FIG. 23D, third page data is written as shown in FIG. 23E. In this case, as shown in FIG. 21, when data in a memory cell 1 is "0" and writing is not executed, the memory cell 1 is subjected to the program operation from data "0" to data "0'".

In the case of four values, data must be written in an erase cell to write data indicative of four threshold voltages "0", "1", "2" and "3". A write speed is lowered as compared with a case where data indicative of three threshold voltages "1", "2" and "3" is written like a conventional example. That is, a write time is increased to be 4/3-fold as compared with the conventional example. However, in the case of eight values, data indicative of eight threshold voltages is written, whereas data indicative of seven threshold voltages is written in the conventional example, and hence an increase of a write time is just 8/7-fold. Further, in the case of 16 values, data indicative of 16 threshold voltages is written, whereas data indicative of 15 threshold voltages is written in the conventional example, and hence an increase in a write time is just 16/15-fold. As described above, as the number of threshold voltages whose data is to be written is increased, an influence of writing data in an erase cell on an entire write speed is reduced.

Furthermore, the description has been give as to the case where four-valued or eight-valued data is written in one cell in the first to fifth embodiments. However, the present invention is not restricted thereto, and the same effects as those of the first to fifth embodiments can be obtained in the case of storing 16-valued or n-valued (n is a natural number) data in one cell by executing the same operations as those in the first to fifth embodiments.

Moreover, the number of the flag cells is not restricted to the number mentioned in each embodiment. That is, at least one is required as the number of the flag cells, but more flag cells can be adopted.

Besides, it is needless to say that various modifications can be carried out without changing a scope of the present invention.

As described above, the present invention can suppress a change in a threshold voltage of an erase cell, and hence it is effective for a field of a semiconductor memory device.

What is claimed is:

1. A semiconductor memory device comprising:
a memory cell array in which a plurality of memory cells which store data in the form of n values (n is a natural number which is not smaller than 2) which are in first and second to nth states are arranged in a matrix form;
and a control circuit which performs a soft program operation in a second memory cell exceeding a first threshold voltage when at least one second memory cell adjacent to a first memory cell is in the first state as an erased state and does not reach the first threshold voltage before a write operation of storing data in the first memory cell in the memory cell array, the soft program operation lessening fluctuation in threshold voltage of the second memory cell by narrowing distribution of the threshold voltage of the second memory cell,
wherein the first threshold voltage is a threshold voltage of the erased state.

2. The semiconductor memory device according to claim 1, wherein j-valued (j <=n) data is stored in the first memory cell before the soft program operation in the second memory cell.

3. The semiconductor memory device according to claim 1, wherein k-valued (k <n) data is stored in at least one third memory cell adjacent to the second memory cell before the soft program operation in the second memory cell up to the first threshold voltage.

4. The semiconductor memory device according to claim 1, wherein the first and second memory cells are adjacent to each other in a direction perpendicular to a word line.

5. The semiconductor memory device according to claim 1, wherein the memory cell array has a word line to which the plurality of memory cells are connected, and first page data and second page data are sequentially written in each half of the memory cells connected with the word line.

6. The semiconductor memory device according to claim 1, further comprising:
a pair of bit lines respectively connected with the plurality of memory cells arranged in a direction perpendicular to the word line; and
a data storage circuit connected with the pair of bit lines, wherein the data storage circuit supplies data to one of the pair of bit lines in a data write operation.

7. The semiconductor memory device according to claim 1, wherein the plurality of memory cells are connected with a word line, first page data is written in all the memory cells connected with the word line, and second page data is sequentially written in all the memory cells connected with a word line adjacent to the word line.

8. The semiconductor memory device according to claim 1, further comprising a plurality of bit lines connected with the plurality of memory cells arranged in a direction perpendicular to a word line; and a plurality of data storage circuits respectively connected with the plurality of bit lines, wherein each data storage circuit supplies data to the corresponding bit line in a data write operation.

9. A semiconductor memory device comprising:

a memory cell array having a structure in which a plurality of memory cells storing first, second, third and fourth states are arranged in a matrix form; and a control circuit which performs a soft program operation exceeding a first threshold voltage when at least one second memory cell adjacent to a first memory cell is in the first state as an erased state and does not reach the first threshold voltage before storing at least one-valued data in the first memory cell in which the first or third state is stored in the memory cell array, the soft program operation lessening fluctuation in threshold voltage of the second memory cell by narrowing distribution of the threshold voltage of the second memory cell, then holds the first state or performs a write operation to obtain the second state when the first memory cell has the first state, and holds the third state or performs a write operation to obtain the fourth state when the first memory cell has the third state, wherein the first threshold voltage is a threshold voltage of the erased state.

10. The semiconductor memory device according to claim 9, wherein data which is in the first or third state is stored in at least one third memory cell adjacent to the second memory cell before the soft program operation in the second memory cell up to the first threshold voltage.

11. The semiconductor memory device according to claim 9, wherein threshold voltages which are in the first, second, third and fourth states are set to have a relationship of the first state <the second state <the third state <the fourth state.

12. A semiconductor memory device comprising:

a memory cell array in which a plurality of memory cells which store n values (n is a natural number which is not smaller than 2) which are in first and second to nth states are arranged in a matrix form; and a control circuit which performs a soft program operation exceeding a first threshold voltage when a first memory cell is in the first state as an erased state and does not reach the first threshold voltage in the case of storing the next data having at least one value in the first memory cell in which j-valued (j<n) data is stored in the memory cell array, the soft program operation lessening fluctuation in threshold voltage of the first memory cell by narrowing distribution of the threshold voltage of the first memory cell, wherein the first threshold voltage is a threshold voltage of the erased state.

13. The semiconductor memory device according to claim 12, wherein the memory cell is set the first state by an erase operation.

14. The semiconductor memory device according to claim 12, wherein the control circuit stores k-valued (k<n) data in at least one second memory cell adjacent to the first memory cell before performing the write operation.

15. The semiconductor memory device according to claim 14, wherein the first and second memory cells are adjacent to each other in a direction perpendicular to a word line.

16. The semiconductor memory device according to claim 12, wherein the memory cell array has a word line to which the plurality of memory cells are connected, and first page data and second page data are sequentially written in each half of the memory cells connected with the word line.

17. The semiconductor memory device according to claim 12, further comprising:

a pair of bit lines respectively connected with the plurality of memory cells arranged in a direction perpendicular to a word line; and a data storage circuit connected with the pair of bit lines, wherein the data storage circuit supplies data to one of the pair of bit lines in a data write operation.

* * * * *